(12) United States Patent
Hirose et al.

(10) Patent No.: US 9,390,916 B2
(45) Date of Patent: *Jul. 12, 2016

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: Hitachi Kokusai Electric Inc., Tokyo (JP)

(72) Inventors: Yoshiro Hirose, Toyama (JP); Kenichi Suzaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 14/747,674

(22) Filed: Jun. 23, 2015

(65) Prior Publication Data

US 2015/0287594 A1 Oct. 8, 2015

Related U.S. Application Data

(63) Continuation of application No. 14/138,776, filed on Dec. 23, 2013, now Pat. No. 9,093,270.

(30) Foreign Application Priority Data

Dec. 25, 2012 (JP) ................................. 2012-281539

(51) Int. Cl.
*H01L 21/20* (2006.01)
*H01L 21/02* (2006.01)
(Continued)

(52) U.S. Cl.
CPC ...... *H01L 21/02532* (2013.01); *C23C 16/0272* (2013.01); *C23C 16/45527* (2013.01); *C23C 16/45544* (2013.01); *C23C 16/52* (2013.01); *H01L 21/0262* (2013.01);
(Continued)

(58) Field of Classification Search
CPC .................. H01L 21/02532; H01L 21/67109; H01L 21/02447; H01L 21/02529; H01L 21/0262
USPC .......................... 438/478, 503, 505, 507, 509
See application file for complete search history.

(56) References Cited

U.S. PATENT DOCUMENTS

| | | | |
|---|---|---|---|
| 8,722,510 B2 | 5/2014 | Watanabe et al. | |
| 8,753,984 B2 | 6/2014 | Murakami et al. | |
| 9,093,270 B2 * | 7/2015 | Hirose | ............. H01L 21/67109 |
| 2006/0286776 A1 | 12/2006 | Ranish et al. | |
| 2009/0029532 A1 | 1/2009 | Huang et al. | |

(Continued)

FOREIGN PATENT DOCUMENTS

JP 2011-249764 A 12/2011

*Primary Examiner* — Kevin M Picardat
(74) *Attorney, Agent, or Firm* — Volpe and Koenig, P.C.

(57) ABSTRACT

A method of manufacturing a semiconductor device can enhance controllability of the diameters of grains of a film containing a predetermined element such as a silicon film when the film is formed. The method includes (a) forming a seed layer containing a predetermined element and carbon on a substrate by performing a cycle a predetermined number of times, the cycle including alternately performing supplying a first source gas containing the predetermined element, an alkyl group and a halogen group to the substrate and supplying a second source gas containing the predetermined element and an amino group to the substrate, or by performing supplying the first source gas to the substrate a predetermined number of times; and (b) forming a film containing the predetermined element on the seed layer by supplying a third source gas containing the predetermined element and free of the alkyl group to the substrate.

18 Claims, 23 Drawing Sheets

(51) Int. Cl.
*H01L 21/67* (2006.01)
*C23C 16/02* (2006.01)
*C23C 16/455* (2006.01)
*C23C 16/52* (2006.01)

(52) U.S. Cl.
CPC ... *H01L 21/02447* (2013.01); *H01L 21/02529* (2013.01); *H01L 21/67109* (2013.01)

(56) References Cited

U.S. PATENT DOCUMENTS

2010/0193664 A1    8/2010   Stoddard
2011/0263105 A1   10/2011   Hasebe et al.
2013/0023110 A1    1/2013   Kakimoto et al.

* cited by examiner

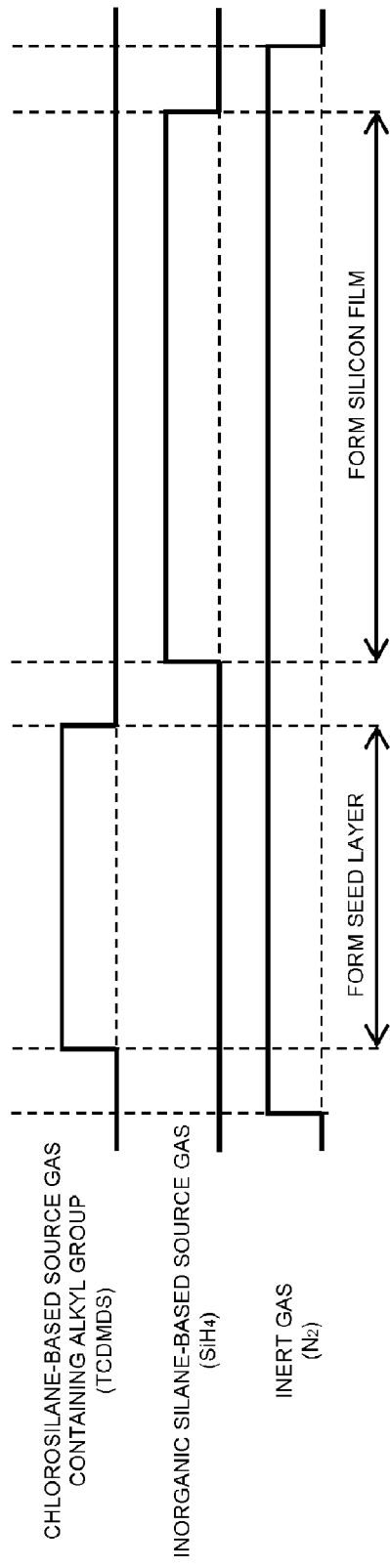

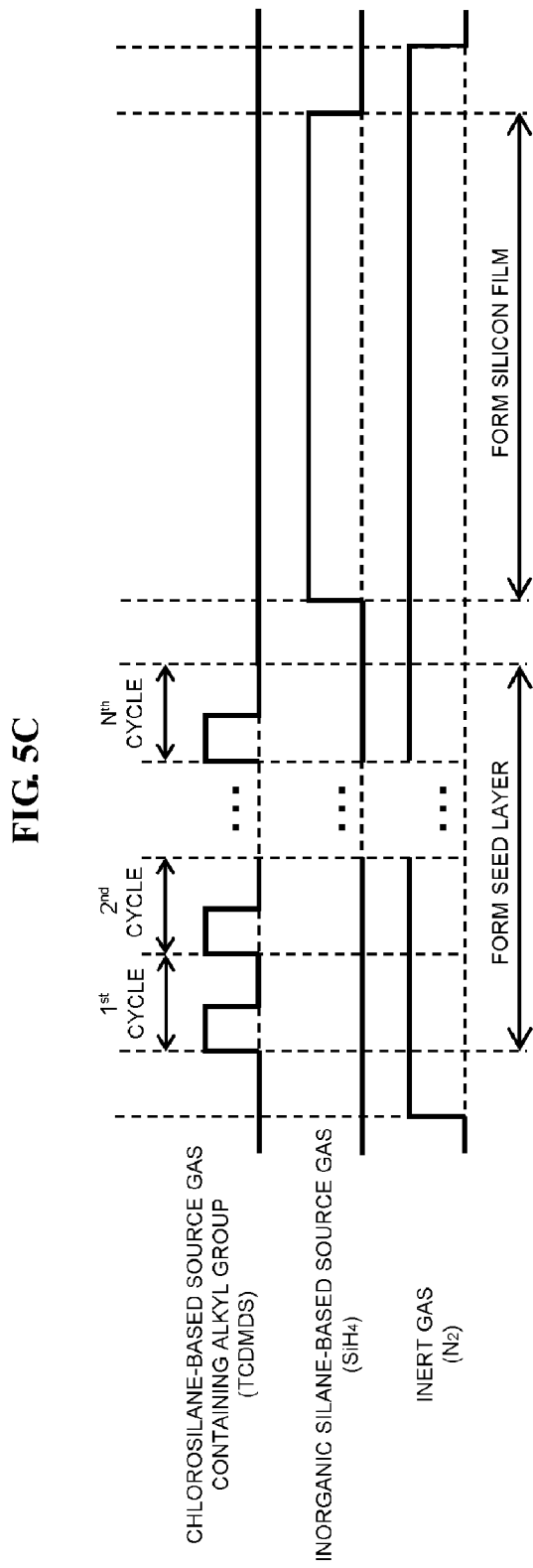

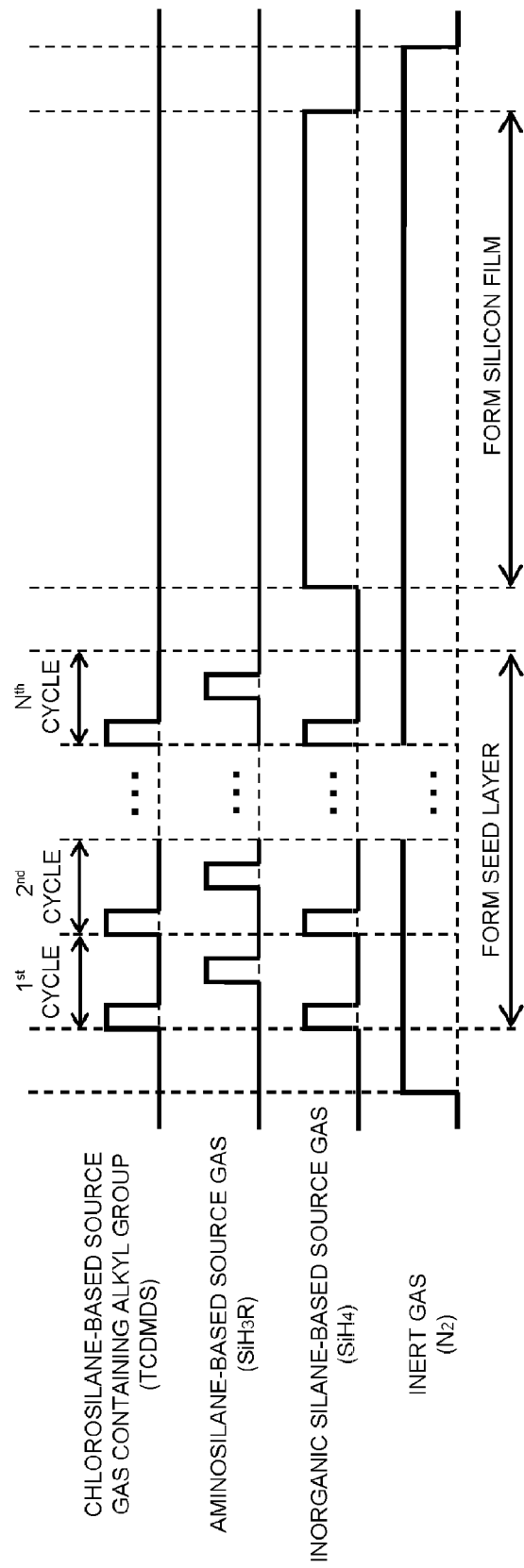

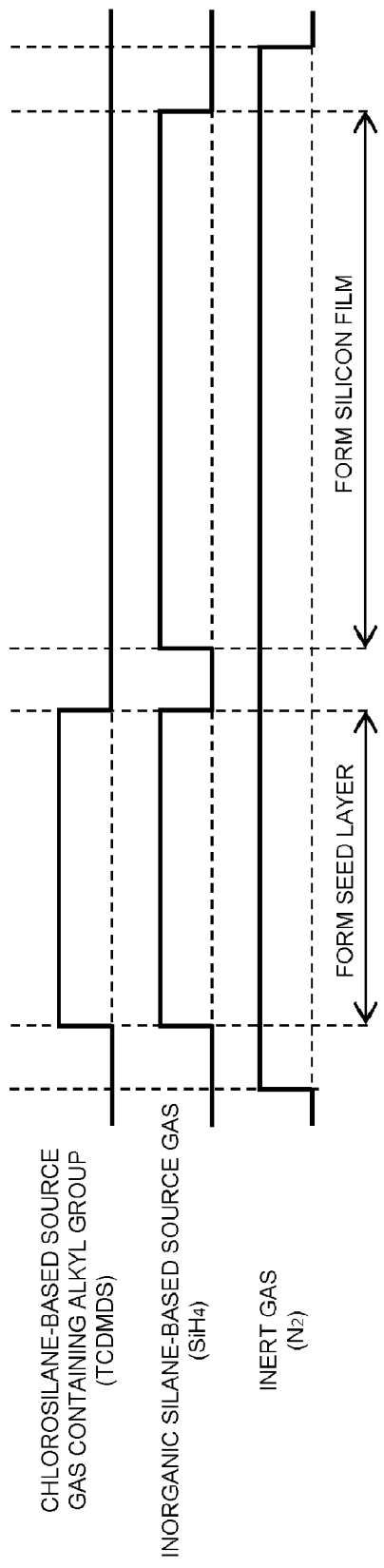

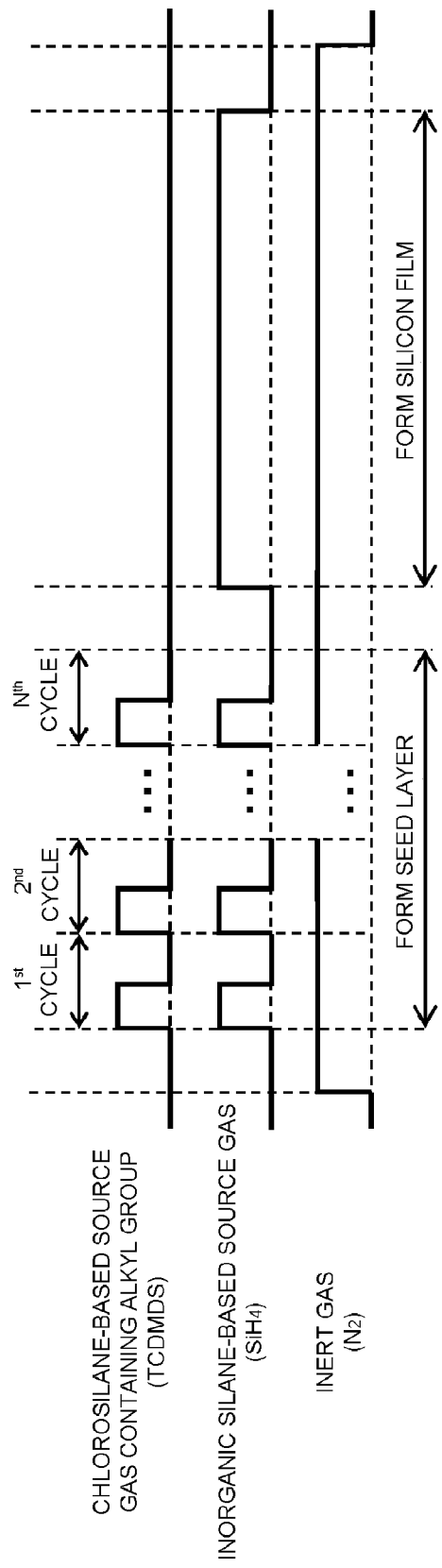

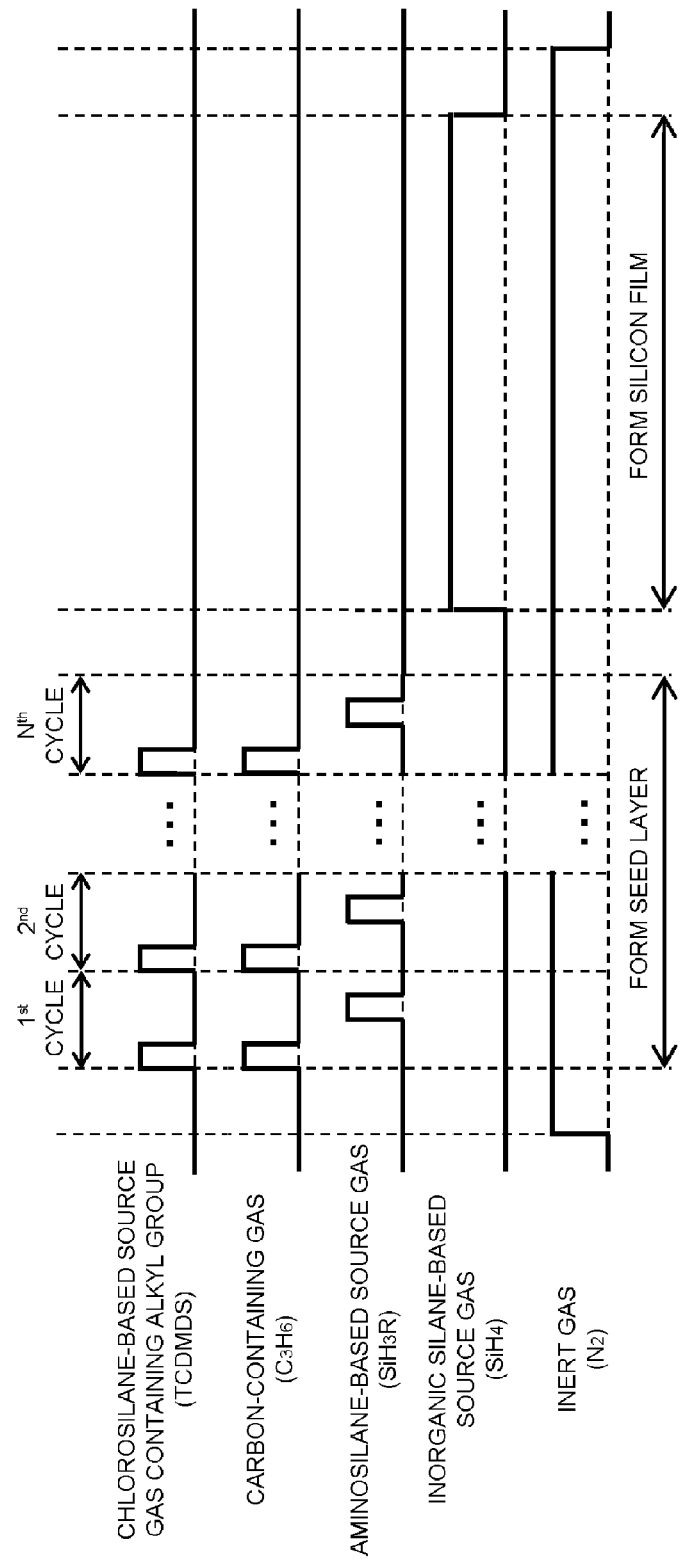

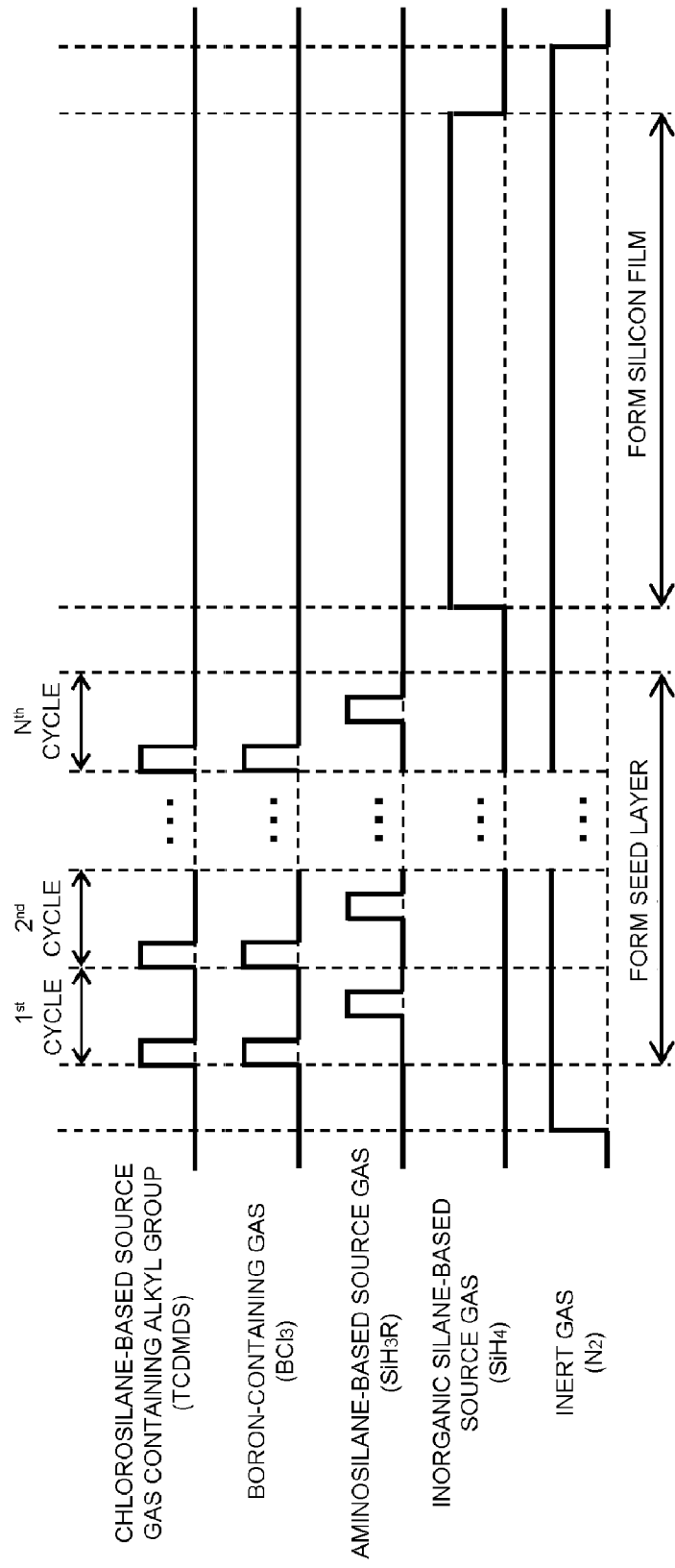

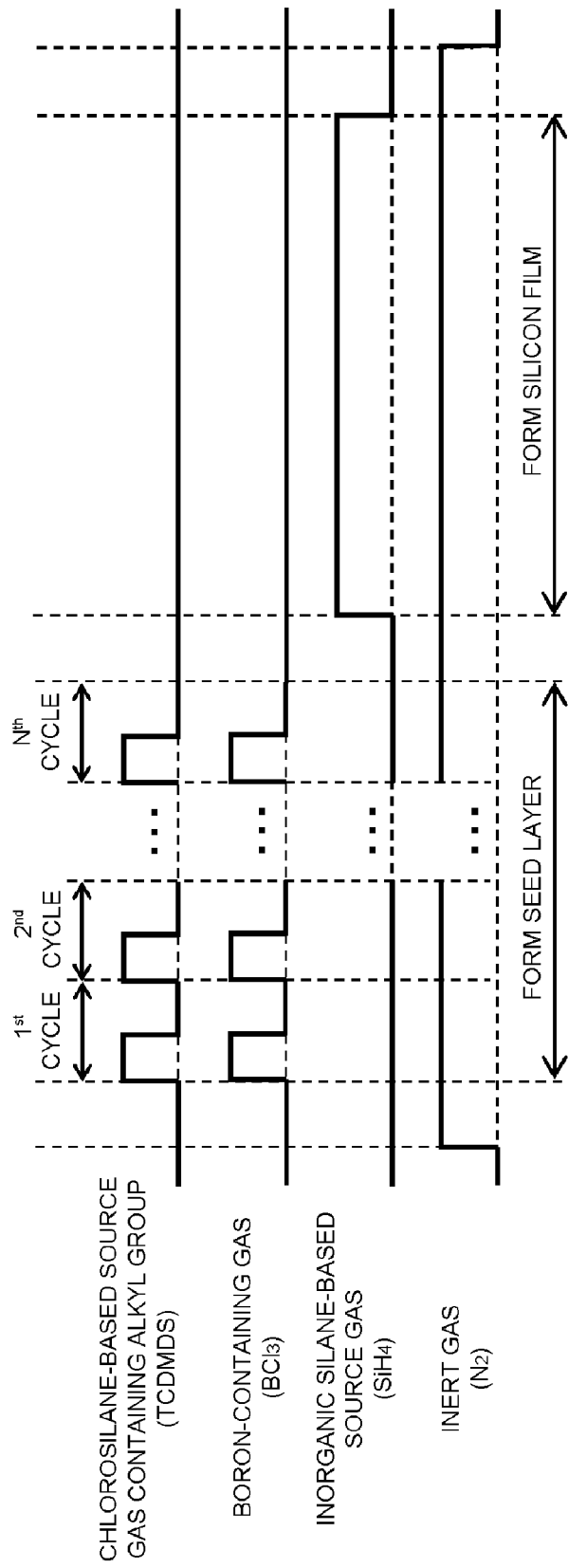

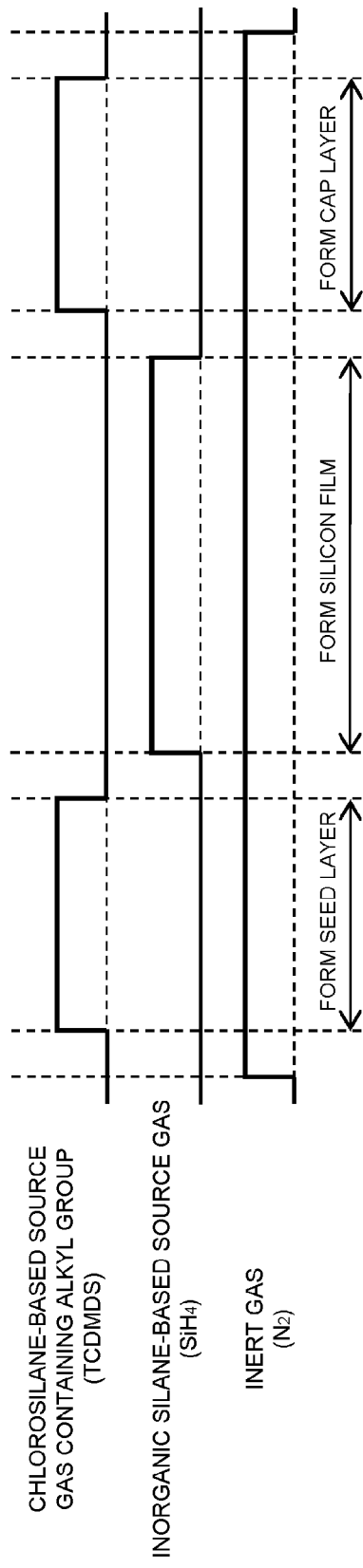

METHOD OF MANUFACTURING SEMICONDUCTOR DEVICE, SUBSTRATE PROCESSING APPARATUS, AND NON-TRANSITORY COMPUTER-READABLE RECORDING MEDIUM

CROSS-REFERENCE TO RELATED PATENT APPLICATION

This U.S. non-provisional patent application is a continuation application of U.S. patent application Ser. No. 14/138,776 and claims priority under 35 U.S.C. §119 of Japanese Patent Application No. 2012-281539 filed on Dec. 25, 2012 in the Japanese Patent Office, the entire contents of which are hereby incorporated by reference.

BACKGROUND OF THE INVENTION

1. Field of the Invention

The present invention relates to a semiconductor device manufacturing method including a process of forming a film on a substrate, a substrate processing apparatus, and a non-transitory computer-readable recording medium.

2. Description of the Related Art

A process of forming a film containing a predetermined element, e.g., silicon (Si), on a substrate may be performed as a process included in a process of manufacturing a semiconductor device (device). For example, a silicon film containing a single element of silicon may be formed by supplying a silicon-containing gas (silicon source), e.g., silane ($SiH_4$) gas, to a heated substrate.

SUMMARY OF THE INVENTION

However, when a silicon film is formed on a substrate using a single type of a silicon source in a low-temperature region, it is difficult to control the diameters (i.e., grain size) of the grains (crystal or non-crystal grains) of a silicon film.

It is an object of the present invention to provide a method of manufacturing a semiconductor device which is capable of improving controllability of the diameters of grains of a film containing a predetermined element, such as a silicon film, when the film is formed, a substrate processing apparatus, and a non-transitory computer-readable recording medium.

According to one aspect of the present invention, there is provided a method of manufacturing a semiconductor device, comprising: (a) forming a seed layer containing a predetermined element and carbon on a substrate by performing a cycle a predetermined number of times, the cycle including alternately or simultaneously performing supplying a first source gas containing the predetermined element, an alkyl group and a halogen group to the substrate and supplying an inorganic second source gas containing the predetermined element to the substrate; and (b) forming a film containing the predetermined element on the seed layer by supplying a third source gas containing the predetermined element and free of the alkyl group to the substrate.

According to another aspect of the present invention, there is provided a substrate processing apparatus comprising: a process chamber configured to accommodate a substrate; a gas supply system configured to supply a gas into the process chamber; and a control unit configured to control the gas supply system so as to: form a seed layer containing a predetermined element and carbon on the substrate in the process chamber by performing a cycle a predetermined number of times, the cycle including alternately or simultaneously performing supplying a first source gas containing the predetermined element, an alkyl group and a halogen group to the substrate and supplying an inorganic second source gas containing the predetermined element to the substrate; and form a film containing the predetermined element on the seed layer by supplying a third source gas containing the predetermined element and free of the alkyl group to the substrate.

According to still another aspect of the present invention, there is provided a non-transitory computer-readable recording medium storing a program for causing a computer to perform: (a) forming a seed layer containing a predetermined element and carbon on a substrate by performing a cycle a predetermined number of times, the cycle including alternately or simultaneously performing supplying a first source gas containing the predetermined element, an alkyl group and a halogen group to the substrate and supplying an inorganic second source gas containing the predetermined element to the substrate; and (b) forming a film containing the predetermined element on the seed layer by supplying a third source gas containing the predetermined element and free of the alkyl group to the substrate.

BRIEF DESCRIPTION OF THE DRAWINGS

FIGS. 5A to 5C are diagrams illustrating gas supply timings in a film forming sequence according to the first embodiment of the present invention, in which FIG. 5A illustrates a first sequence, FIG. 5B illustrates a second sequence, and FIG. 5C illustrates a third sequence.

FIGS. 6A to 6C are diagrams illustrating gas supply timings in a film forming sequence according to the second embodiment of the present invention, in which FIG. 6A illustrates a first sequence, FIG. 6B illustrates a second sequence, and FIG. 6C illustrates a third sequence.

FIGS. 7A to 7C are diagrams illustrating gas supply timings in a film forming sequence according to the third embodiment of the present invention, in which FIG. 7A illustrates a first sequence, FIG. 7B illustrates a second sequence, and FIG. 7C illustrates a third sequence.

FIGS. 8A to 8C are diagrams illustrating gas supply timings in a film forming sequence according to the fourth embodiment of the present invention, in which FIG. 8A illustrates a first sequence, FIG. 8B illustrates a second sequence, and FIG. 8C illustrates a third sequence.

FIGS. 9A to 9C are diagrams illustrating gas supply timings in a film forming sequence according to the fifth embodiment of the present invention, in which FIG. 9A illustrates a first sequence, FIG. 9B illustrates a second sequence, and FIG. 9C illustrates a third sequence.

FIGS. 10A to 10C are diagrams illustrating gas supply timings in a film forming sequence according to a sixth embodiment of the present invention, in which FIG. 10A illustrates a first sequence, FIG. 10B illustrates a second sequence, and FIG. 10C illustrates a third sequence.

DETAILED DESCRIPTION OF THE PREFERRED EMBODIMENTS

First Embodiment of the Present Invention

A first embodiment of the present invention will now be described with reference to the accompanying drawings.

(1) Structure of a Substrate Processing Apparatus

Figure 1:
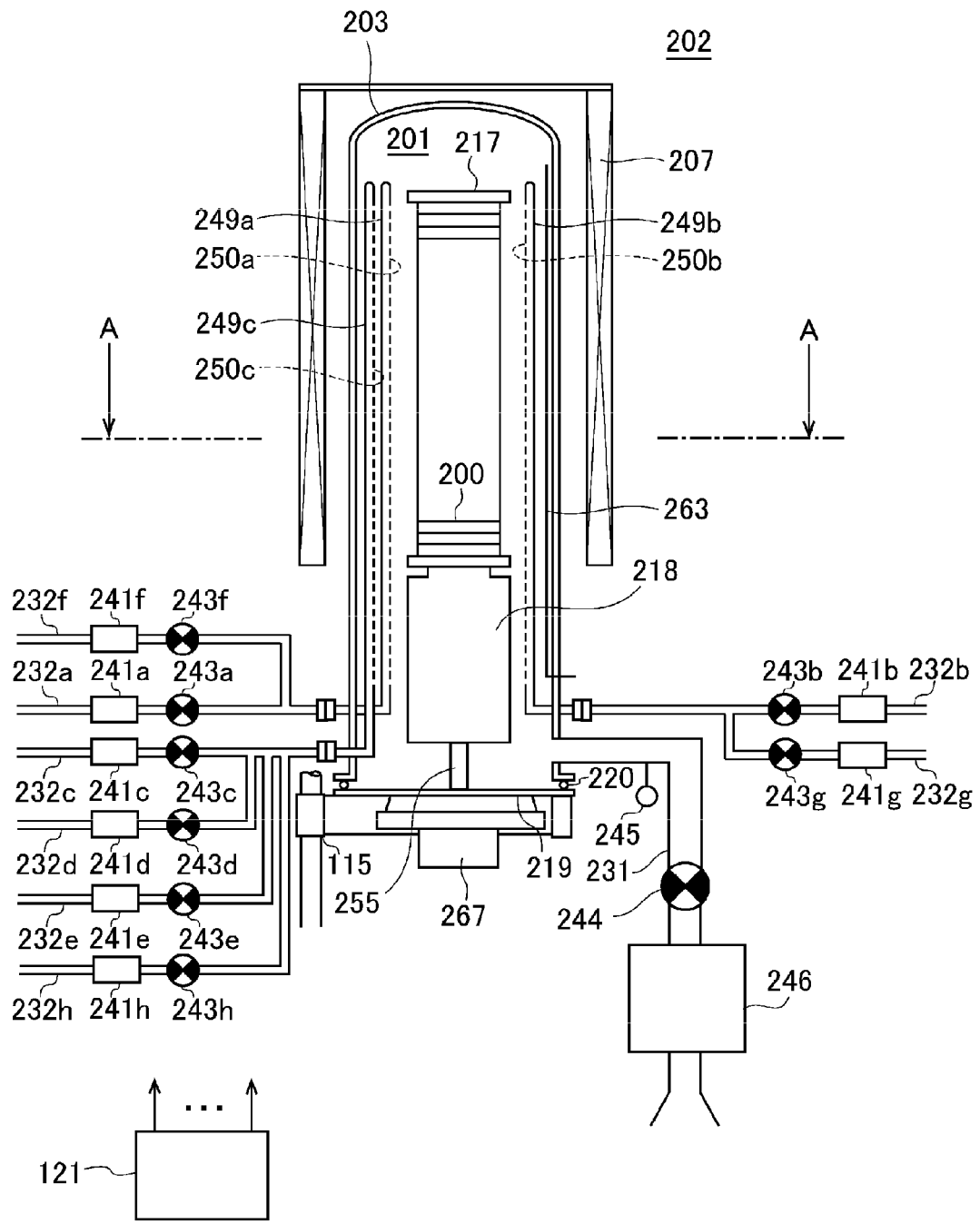
FIG. 1 is a schematic configuration diagram of a longitudinal process furnace of a substrate processing apparatus according to an exemplary embodiment of the present invention, in which a process furnace portion is illustrated in a longitudinal cross-sectional view.
Figure 2:
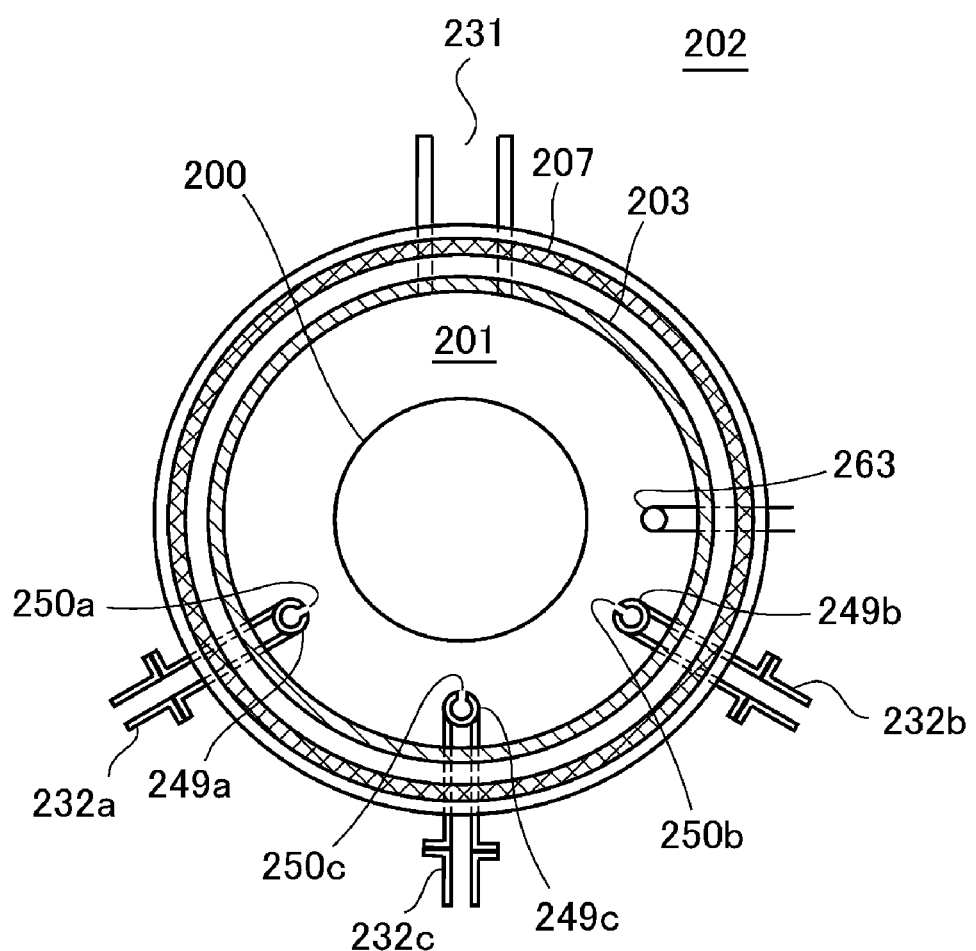
FIG. 2 is a schematic configuration diagram of a longitudinal process furnace of a substrate processing apparatus according to an exemplary embodiment of the present invention, in which a process furnace portion is illustrated in a cross-sectional view taken along line A-A of FIG. 1.

FIG. 1 is a schematic configuration diagram of a longitudinal process furnace of a substrate processing apparatus according to an exemplary embodiment of the present invention, in which a process furnace 202 is illustrated in a longitudinal cross-sectional view. FIG. 2 is a schematic configuration diagram of a longitudinal process furnace of a substrate processing apparatus according to an exemplary embodiment of the present invention, in which a process furnace 202 is illustrated in a cross-sectional view taken along line A-A of FIG. 1.

As illustrated in FIG. 1, the process furnace 202 includes a heater 207 functioning as a heating unit (heating mechanism). The heater 207 has a cylindrical shape and is vertically installed by being supported by a heater base (not shown) serving as a retainer plate. The heater 207 also functions as an activation mechanism (excitation unit) that causes activation (excitation) using heat as will be described below.

At an inner side of the heater 207, a reaction tube 203 that forms a reaction container (process container) is disposed concentrically with the heater 207. The reaction tube 203 is formed of a heat-resistant material, e.g., quartz ($SiO_2$) or silicon carbide (SiC), and has a cylindrical shape, the upper end of which is closed and the lower end of which is open. A process chamber 201 is formed in a hollow tubular portion of the reaction tube 203, and is configured to accommodate wafers 200 which are substrates such that the wafers 200 are vertically arranged in a multistage and a horizontal posture by a boat 217 which will be described below.

In the process chamber 201, a first nozzle 249a, a second nozzle 249b, and a third nozzle 249c are installed to pass through a lower portion of the reaction tube 203. The first nozzle 249a, the second nozzle 249b, and the third nozzle 249c are connected to a first gas supply pipe 232a, a second gas supply pipe 232b, and a third gas supply pipe 232c, respectively. Also, the third gas supply pipe 232c is connected to a fourth gas supply pipe 232d and a fifth gas supply pipe 232e, respectively. As described above, the three nozzles 249a, 249b, and 249c, the five gas supply pipes 232a, 232b, 232c, 232d, and 232e are installed at the reaction tube 203, and the reaction tube 203 is configured to supply a plurality of types of gases (five types of gases in the present embodiment) into the process chamber 201.

Also, a metal manifold supporting the reaction tube 203 may be installed below the reaction tube 203, and the above nozzles may be installed to pass through side walls of the metal manifold. In this case, an exhaust pipe 231 which will be described below may be further installed at the metal manifold. Also, in this case, the exhaust pipe 231 may be installed below the reaction tube 203 rather than at the metal manifold. As described above, a furnace port of the process furnace 202 may be formed of a metal, and a nozzle or the like may be installed at the metal furnace port.

At the first gas supply pipe 232a, a mass flow controller (MFC) 241a which is a flow rate controller (flow rate control unit) and a valve 243a which is an opening/closing valve are sequentially installed in an upstream direction. Also, a first inert gas supply pipe 232f is connected to the first gas supply pipe 232a at a downstream side of the valve 243a. At the first inert gas supply pipe 232f, an MFC 241f which is a flow rate controller (flow rate control unit) and a valve 243f which is an opening/closing valve are sequentially installed in the upstream direction. Also, the first nozzle 249a is connected to a front end of the first gas supply pipe 232a. The first nozzle 249a is installed in an arc-shaped space between inner walls of the reaction tube 203 and the wafers 200 to move upward from lower inner walls of the reaction tube 203 in a direction in which the wafers 200 are stacked. In other words, the first nozzle 249a is installed along a wafer arrangement region in which the wafers 200 are arranged, in a region that horizontally surrounds the wafer arrangement region at sides of the wafer arrangement region. The first nozzle 249a is configured as an L-shaped long nozzle, and includes a horizontal portion passing through lower sidewalls of the reaction tube 203 and a vertical portion moving upward at least from one end of the wafer arrangement region toward the other end thereof. A plurality of gas supply holes 250a are formed in a side surface of the first nozzle 249a to supply a gas. The plurality of gas supply holes 250a open toward a center of the reaction tube 203 to supply a gas toward the wafers 200. The plurality of gas supply holes 250a are formed from a lower portion of the reaction tube 203 to an upper portion thereof, and each have the same opening area at the same opening pitch.

A first gas supply system mainly includes the first gas supply pipe 232a, the MFC 241a, and the valve 243a. The first nozzle 249a may be further included in the first gas supply system. A first inert gas supply system mainly includes the first inert gas supply pipe 232f, the MFC 241f, and the valve 243f. The first inert gas supply system also functions as a purge gas supply system.

At the second gas supply pipe 232b, an MFC 241b which is a flow rate controller (flow rate control unit) and a valve 243b which is an opening/closing valve are sequentially installed in the upstream direction. A second inert gas supply pipe 232g is connected to the second gas supply pipe 232b at a downstream side of the valve 243b. At the second inert gas supply pipe 232g, an MFC 241g which is a flow rate controller (flow rate control unit) and a valve 243g which is an opening/closing valve are sequentially installed in the upstream direction. The second nozzle 249b is connected to a front end of the second gas supply pipe 232b. The second nozzle 249b is installed in the arc-shaped space between the inner walls of the reaction tube 203 and the wafers 200 to move upward from the lower inner walls of the reaction tube 203 in the direction in which the wafers 200 are stacked. In other words, the second nozzle 249b is installed along the wafer arrangement region in which the wafers 200 are arranged, in the region that horizontally surrounds the wafer arrangement region at the sides of the wafer arrangement region. The second nozzle 249b is configured as an L-shaped long nozzle, and includes a horizontal portion passing through the lower sidewalls of the reaction tube 203 and a vertical portion moving upward at least from one end of the wafer arrangement region toward the other end thereof. A plurality of gas supply holes 250b are formed in a side surface of the second nozzle 249b to supply a gas. The plurality of gas supply holes 250b open toward the center of the reaction tube 203 to supply a gas toward the wafers 200. The plurality of gas supply holes 250b are formed from the lower portion of the reaction tube 203 to the upper portion thereof, and each have the same opening area at the same opening pitch.

A second gas supply system mainly includes the second gas supply pipe 232b, the MFC 241b, and the valve 243b. The second nozzle 249b may be further included in the second gas supply system. A second inert gas supply system mainly includes the second inert gas supply pipe 232g, the MFC 241g, and the valve 243g. The second inert gas supply system also functions as a purge gas supply system.

At the third gas supply pipe 232c, an MFC 241c which is a flow rate controller (flow rate control unit) and a valve 243c which is an opening/closing valve are sequentially installed in the upstream direction. The fourth gas supply pipe 232d and the fifth gas supply pipe 232e are connected to the third gas supply pipe 232c at a downstream side of the valve 243c. At the fourth gas supply pipe 232d, an MFC 241d which is a flow rate controller (flow rate control unit) and a valve 243d which is an opening/closing valve are sequentially installed in the upstream direction. At the fifth gas supply pipe 232e, an MFC 241e which is a flow rate controller (flow rate control unit) and a valve 243e which is an opening/closing valve are sequentially installed in the upstream direction. A third inert gas supply pipe 232h is connected to the third gas supply pipe 232c at a downstream side of a contact position with the fourth gas supply pipe 232d and the fifth gas supply pipe 232e. At the third inert gas supply pipe 232h, an MFC 241h which is a flow rate controller (flow rate control unit) and a valve 243h which is an opening/closing valve are sequentially installed in the upstream direction. The third nozzle 249c is connected to a front end of the third gas supply pipe 232c. The third nozzle 249c is installed in the arc-shaped space between the inner walls of the reaction tube 203 and the wafers 200 to move upward from the lower inner walls of the reaction tube 203 in the direction in which the wafers 200 are stacked. In other words, the third nozzle 249c is installed along the wafer arrangement region in which the wafers 200 are arranged, in the region that horizontally surrounds the wafer arrangement region at the sides of the wafer arrangement region. The third nozzle 249c is configured as an L-shaped long nozzle, and includes a horizontal portion passing through the lower sidewalls of the reaction tube 203 and a vertical portion moving upward at least from one end of the wafer arrangement region toward the other end thereof. A plurality of gas supply holes 250c are formed in a side surface of the third nozzle 249c to supply a gas. The plurality of gas supply holes 250c open toward the center of the reaction tube 203 to supply a gas toward the wafers 200. The plurality of gas supply holes 250c are formed from the lower portion of the reaction tube 203 to the upper portion thereof, and each have the same opening area at the same opening pitch.

A third gas supply system mainly includes the third gas supply pipe 232c, the MFC 241c, and the valve 243c. The third nozzle 249c may be further included in the third gas supply system. A fourth gas supply system mainly includes the fourth gas supply pipe 232d, the MFC 241d, and the valve 243d. The third nozzle 249c disposed at a downstream side of a contact portion of the third gas supply pipe 232c and the fourth gas supply pipe 232d may be further included in the fourth gas supply system. A fifth gas supply system mainly includes the fifth gas supply pipe 232e, the MFC 241e, and the valve 243e. The third nozzle 249c disposed at a downstream side of a contact portion of the third gas supply pipe 232c and the fifth gas supply pipe 232e may be further included in the fifth gas supply system. A third inert gas supply system mainly includes the third inert gas supply pipe 232h, the MFC 241h, and the valve 243h. The third inert gas supply system also functions as a purge gas supply system.

As described above, in a gas supply method according to the present embodiment, gases are transferred via the nozzles 249a, 249b, and 249c arranged in the arc-shaped space that is a vertically long space defined with the inner walls of the reaction tube 203 and the end portions of the plurality of stacked wafers; are emitted into the reaction tube 203 near the wafers 200 from the plurality of gas supply holes 250a, 250b, and 250c that are open in the nozzles 249a, 249b, and 249c, respectively; and flow mainly in the reaction tube 203 in a direction that is parallel with surfaces of the wafers 200, i.e., a horizontal direction. Accordingly, a gas may be evenly supplied to the wafers 200, and a film may be formed on each of the wafers 200 to a uniform thickness. Also, a gas flowing along the surfaces of the wafer 200, i.e., a gas remaining after a reaction, flows toward an exhaust mechanism, i.e., the exhaust pipe 231 which will be described below, but a direction in which the gas flows is not limited to a vertical direction and may vary according to the location of the exhaust mechanism.

A chlorosilane-based source gas containing an alkyl group is supplied as a first source including a predetermined element, an alkyl group, and a halogen group (e.g., a first source gas containing at least silicon (Si), an alkyl group, and a chloro group) into the process chamber 201 from the first gas supply pipe 232a via the MFC 241a, the valve 243a, and the first nozzle 249a. Here, the chlorosilane-based source gas means a gaseous chlorosilane-based source, e.g., a gas obtained by vaporizing a chlorosilane-based source that is in a liquid state at room temperature and pressure, or a chlorosilane-based source that is a gaseous state at room temperature and pressure. Also, the chlorosilane-based source is a silane-based source containing a chloro group as a halogen group, and means a source containing at least silicon (Si) and chlorine (Cl). That is, the chlorosilane-based source may be understood as a type of a halide herein. Also, the alkyl group is a functional group obtained by removing one hydrogen (H) atom from open-chain saturated hydrocarbon (alkane) expressed in a general formula of $C_nH_{2n+2}$, and is an aggregate of atoms, such as a methyl group, an ethyl group, or a butyl group, which is expressed in a general formula of $C_nH_{2n+1}$. That is, the chlorosilane-based source containing the alkyl group means a source that contains at least silicon (Si), chlorine (Cl), carbon (C), and hydrogen (H) but does not contain nitrogen (N). In other words, here, the chlorosilane-based source containing the alkyl group may be understood as an organic source or an organic chlorosilane-based source (carbon-containing silicon source). When the term "source" is used in the present disclosure, it may be understood as "a liquid source in a liquid state," "a source gas in a gaseous state," or both of them. Thus, when the term "chlorosilane-based source containing an alkyl group" is used in the present disclosure, it may be understood as "a chlorosilane-based source containing an alkyl group that is in a liquid state," "a chlorosilane-based source containing an alkyl group that is in a gaseous state," or both of them.

Figure 11A:
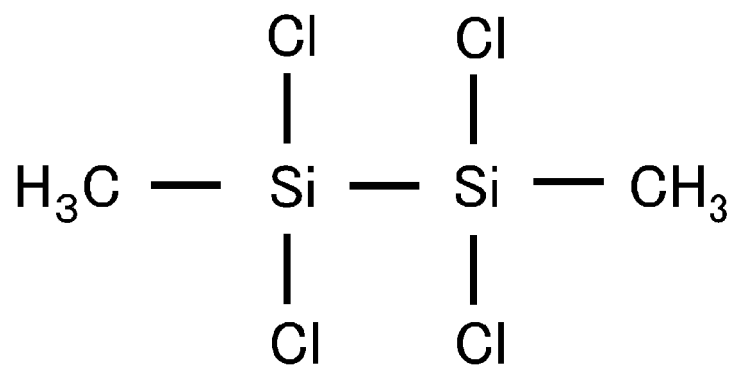
FIG. 11A illustrates a chemical formula of TCDMDS.

A gas containing a plurality of alkyl groups and a plurality of chloro groups in an empirical formula (one molecule) thereof is preferably used as the chlorosilane-based source gas containing an alkyl group. Also, when a coordination of a plurality of alkyl groups is present in the empirical formula, the plurality of alkyl groups may be the same alkyl groups or may include different alkyl groups. Also, the alkyl group may include an unsaturated bond such as a double bond or a triple bond. Also, the alkyl group may have a ring-shaped structure. For example, 1,1,2,2-tetrachloro-1,2-dimethyldisilane (abbreviated to: TCDMDS) gas containing two alkyl groups ($CH_3$) and four chloro (Cl) groups in an empirical formula may be used as the chlorosilane-based source gas containing an alkyl group. FIG. 11A illustrates a chemical formula of TCDMDS. When a liquid source such as TCDMDS which is in a liquid state at room temperature and pressure is used, the liquid source is vaporized using an vaporization system such as a vaporizer or a bubbler and is then supplied as the first source gas (TCDMDS gas).

Aminosilane-based source gas is supplied as a second source including a predetermined element and an amino group (amine group), e.g., a second source gas containing at least silicon (Si) and an amino group, into the process chamber 201 from the second gas supply pipe 232b via the MFC 241b, the valve 243b, and the second nozzle 249b. Here, the aminosilane-based source means a silane-based source containing an amino group (silane-based source containing not only the amino group but also an alkyl group such as a methyl group, an ethyl group, or a butyl group), and a source containing at least silicon (Si), carbon (C), and nitrogen (N). Herein, the aminosilane-based source may be understood as an organic source or an organic aminosilane-based source (carbon-containing silicon source). Also, when the term "aminosilane-based source" is used in the present disclosure, it may be understood as an "aminosilane-based source in a liquid state," an "aminosilane-based source gas in a gaseous state," or both of them.

The aminosilane-based source gas is preferably a gas containing one or more amino groups in an empirical formula (in one molecule) and is more preferably a gas containing one amino group in the empirical formula. For example, the aminosilane-based source gas may be monoaminosilane ($SiH_3R$) gas containing one amino group in an empirical formula, in which "R" denotes a ligand and is an amino group in which one nitrogen (N) atom coordinates with one or two hydrocarbon groups each containing one or more carbon (C) atoms [one or both sides of one H atom in an amino group expressed as $NH_2$ are substituted with a hydrocarbon group including one or more carbon (C) atoms]. When two hydrocarbon groups each of which is a part of the amino group coordinate with one N, these hydrocarbon groups may be the same hydrocarbon group or different hydrocarbon groups. Also, the hydrocarbon group may include an unsaturated bond such as a double bond or a triple bond. Also, the amino group may have a ring-shaped structure. For example, ethylmethylaminosilane ($SiH_3[N(CH_3(C_2H_5))]$), dimethylaminosilane ($SiH_3[N(CH_3)_2]$), diethylpiperidinosilane ($SiH_3[NC_5H_8(C_2H_5)_2]$), etc. may be used as $SiH_3R$. When a liquid source such as $SiH_3R$ that is in a liquid state at room temperature and pressure is used, the liquid source is vaporized using a vaporization system such as a vaporizer or a bubbler and is then supplied as the second source gas ($SiH_3R$ gas).

An alkyl group-free silane-based source gas containing, for example, silicon (Si), i.e., a carbon-free inorganic silane-based source gas that does not contain carbon (C) (a carbon-free silicon source) is supplied as an alkyl group-free third source containing a predetermined element into the process chamber 201 from the third gas supply pipe 232c via the MFC 241c, the valve 243c, and third nozzle 249c. The third source gas may be an amino group-free silane-based source gas that contains a predetermined element. That is, the third source gas may be an alkyl group and amino group-free silane-based source gas that contains a predetermined element. For example, monosilane ($SiH_4$) gas may be used as a silane-based source gas (inorganic silane-based source gas).

A gas containing carbon (C) (carbon-containing gas) is supplied as a carbon source into the process chamber 201 from the fourth gas supply pipe 232d via the MFC 241d, the valve 243d, the third gas supply pipe 232c, and the third nozzle 249c. For example, propylene ($C_3H_6$) gas which is a hydrocarbon-based gas may be used as the carbon-containing gas.

A gas containing boron (B) (boron-containing gas) is supplied as a boron source into the process chamber 201 from the fifth gas supply pipe 232e via the MFC 241e, the valve 243e, the third gas supply pipe 232c, and the third nozzle 249c. For example, boron trichloride ($BCl_3$) gas which is a boron halide-based gas may be used as the boron-containing gas.

For example, nitrogen ($N_2$) gas is supplied as an inert gas into the process chamber 201 from the inert gas supply pipes 232f, 232g, and 232h via the MFCs 241f, 241g, and 241h, the valves 243f, 243g, and 243h, the gas supply pipes 232a, 232b, and 232c, and the nozzles 249a, 249b, and 249c.

Also, when the gases described above are supplied from, for example, these gas supply pipes, a chlorosilane-based source gas (including an alkyl group) supply system is configured as a first source supply system that supplies a first source including a predetermined element, an alkyl group, and a halogen group (i.e., a first source gas supply system) using the first gas supply system. The chlorosilane-based source gas (including an alkyl group) supply system is also referred to simply as a chlorosilane-based source (including an alkyl group) supply system. Also, an aminosilane-based source gas supply system is configured as a second source supply system that supplies a second source including a predetermined element and an amino group (i.e., a second source gas supply system) using the second gas supply system. The aminosilane-based source gas supply system is also referred to simply as an aminosilane-based source supply system. Also, a silane-based source gas supply system (inorganic silane-based source gas supply system) is configured as a third source supply system that supplies a third source including a predetermined element (i.e., a third source gas supply system) and free of alkyl group using the third gas supply system. The silane-based source gas supply system (inorganic silane-based source gas supply system) is also referred to simply as a silane-based source supply system (inorganic silane-based source supply system). A hydrocarbon-based gas supply system is configured as a carbon-containing gas supply system that supplies a carbon-containing gas using the fourth gas supply system. Also, a boron halide-based gas supply system is configured as a boron-containing gas supply system that supplies a boron-containing gas using the fifth gas supply system.

The exhaust pipe 231 is installed at the reaction tube 203 to exhaust the atmosphere in the process chamber 201. Referring to the cross-sectional view of FIG. 2, the exhaust pipe 231 is installed at a side opposite to sides of the reaction tube 203 in which the gas supply holes 250a of the first nozzle 249a, the gas supply holes 250b of the second nozzle 249b, and the gas supply holes 250c of the third nozzle 249c are formed, i.e., at a side opposite to the gas supply holes 250a, 250b, and 250c with respect to the wafers 200. Also, referring to the longitudinal cross-sectional view of FIG. 1, the exhaust pipe 231 is installed below the positions at which the gas supply holes 250a, 250b, and 250c are formed. Thus, a gas supplied from the gas supply holes 250a, 250b, and 250c at a position in the process chamber 201 near the wafers 200 flows in a horizontal direction, i.e., a direction parallel with surfaces of the wafers 200, flows downward, and is then exhausted via the exhaust pipe 231. In the process chamber 201, a main gas flow occurs in the horizontal direction as described above.

To the exhaust pipe 231, a pressure sensor 245 serving as a pressure detector (pressure detection unit) configured to detect pressure in the process chamber 201 is connected, and a vacuum pump 246 serving as a vacuum exhaust device is connected via an auto pressure controller (APC) valve 244 serving as a pressure adjustor (pressure adjustment unit). Also, the APC valve 244 may be configured to vacuum-exhaust the inside of the process chamber 201 or suspend the vacuum-exhausting by opening/closing the APC valve 244 while the vacuum pump 246 is operated, and to adjust pressure in the process chamber 201 by adjusting a degree of openness of the APC valve 244 while the vacuum pump 246 is operated. An exhaust system mainly includes the exhaust pipe 231, the APC valve 244, and the pressure sensor 245. The vacuum pump 246 may be further included in the exhaust system. The exhaust system is configured to vacuum-exhaust the inside of the process chamber 201 by adjusting the degree of openness of the APC valve 244 while operating the vacuum pump 246 based on pressure information detected by the pressure sensor 245, so that the pressure in the process chamber 201 may be equal to a desired pressure (degree of vacuum).

Below the reaction tube 203, a seal cap 219 is installed as a furnace port lid that may air-tightly close a lower end aperture of the reaction tube 203. The seal cap 219 is configured to contact a lower end of the reaction tube 203 from a lower portion thereof in a vertical direction. The seal cap 219 is formed of a metal, such as stainless steel, and has a disk shape. An O-ring 220 serving as a seal member that contacts the lower end of the reaction tube 203 is installed on an upper surface of the seal cap 219. A rotating mechanism 267 that rotates the boat 217 as a substrate retainer (which will be described below) is installed at a side of the seal cap 219 opposite to the process chamber 201. A rotation shaft 255 of the rotating mechanism 267 is connected to the boat 217 while passing through the seal cap 219. The rotating mechanism 267 is configured to rotate the wafers 200 by rotating the boat 217. The seal cap 219 is configured to be vertically moved by a boat elevator 115 that is a lifting mechanism vertically installed outside the reaction tube 203. The boat elevator 115 is configured to load the boat 217 into or unload the boat 217 from the process chamber 201 by moving the seal cap 219 upward/downward. That is, the boat elevator 115 is configured as a transfer device (transfer mechanism) that transfers the boat 217, i.e., the wafers 200, inside or outside the process chamber 201.

The boat 217 serving as a substrate supporter is formed of a heat-resistant material, e.g., quartz or silicon carbide, and is configured to support the plurality of wafers 200 in a state in which the wafers 200 are arranged in a concentrically multi-layered structure in a horizontal posture. Below the boat 217, an insulating member 218 formed of a heat-resistant material, e.g., quartz or silicon carbide, is installed and configured to prevent heat generated from the heater 207 from being transferred to the seal cap 219. Also, the insulating member 218 may include a plurality of insulating plates formed of a heat-resistant material, e.g., quartz or silicon carbide, and an insulating plate holder that supports the plurality of insulating plates in a multilayered structure in a horizontal posture.

In the reaction tube 203, a temperature sensor 263 is installed as a temperature detector, and is configured to control an amount of current to be supplied to the heater 207 based on temperature information detected by the temperature sensor 263, so that the temperature in the process chamber 201 may have a desired temperature distribution. The temperature sensor 263 has an L-shape similar to the nozzles 249a, 249b, and 249c, and is installed along an inner wall of the reaction tube 203.

Figure 3:
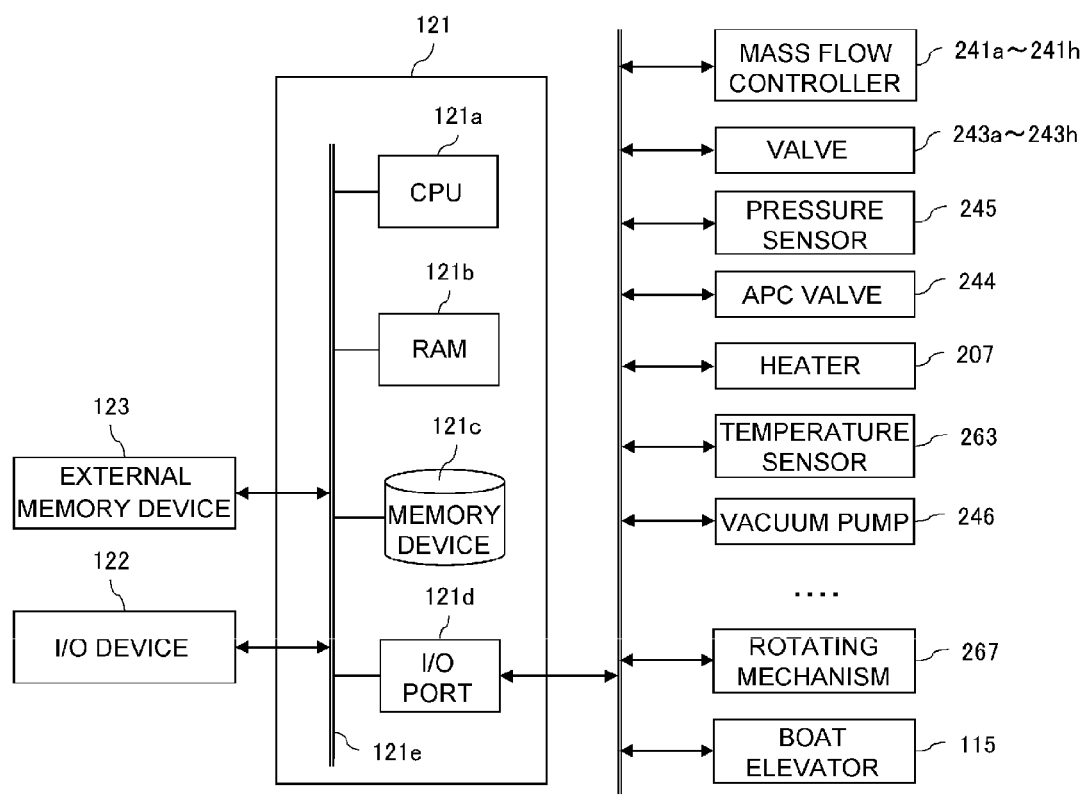
FIG. 3 is a schematic configuration diagram of a controller of a substrate processing apparatus according to an exemplary embodiment of the present invention, in which a control system of the controller is illustrated in a block diagram.

As illustrated in FIG. 3, a controller 121 which is a control unit (control means) is configured as a computer including a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 121e. An I/O device 122 configured, for example, as a touch panel is connected to the controller 121.

The memory device 121c is configured, for example, as a flash memory, a hard disk drive (HDD), or the like. In the memory device 121c, a control program for controlling an operation of the substrate processing apparatus or a process recipe instructing an order or conditions of substrate processing which will be described below are stored to be readable. The program recipe is a combination of sequences of a substrate processing process (which will be described below) to obtain a desired result when the sequences are performed by the controller 121, and acts as a program. Hereinafter, such a process recipe, a control program, etc. will be referred to together simply as a "program." Also, when the term "program" is used in the present disclosure, it should be understood as including only a program recipe, only a control program, or both of the program recipe and the control program. The RAM 121b is configured as a work area in which a program or data read by the CPU 121a is temporarily stored.

The I/O port 121d is connected to the MFCs 241a, 241b, 241c, 241d, 241e, 241f, 241g, and 241h, the valves 243a, 243b, 243c, 243d, 243e, 243f, 243g, and 243h, the pressure sensor 245, the APC valve 244, the vacuum pump 246, the heater 207, the temperature sensor 263, the rotating mechanism 267, the boat elevator 115, etc.

The CPU 121a is configured to read and execute the control program from the memory device 121c and to read the process recipe from the memory device 121c according to a manipulation command received via the I/O device 122. Also, according to the read program recipe, the CPU 121a controls flow rates of various gases via the MFCs 241a, 241b, 241c, 241d, 241e, 241f, 241g, and 241h; controls opening/closing of the valves 243a, 243b, 243c, 243d, 243e, 243f, 243g, and 243h; controls the degree of pressure using the APC valve 244 by opening/closing the APC valve 244 and based on the pressure sensor 245; controls temperature using the heater 207 based on the temperature sensor 263; controls driving/suspending of the vacuum pump 246; controls the rotation and rotation speed of the boat 217 using the rotating mechanism 267; controls upward/downward movement of the boat 217 using the boat elevator 115, etc.

The controller 121 is not limited to a dedicated computer and may be configured as a general-purpose computer. For example, the controller 121 according to the present embodiment may be configured by preparing an external memory device 123 storing such programs, e.g., a magnetic disk (a magnetic tape, a flexible disk, a hard disk, etc.), an optical disc (a compact disc (CD), a digital versatile disc (DVD), etc.), a magneto-optical disc (MO), or a semiconductor memory (a universal serial bus (USB) memory, a memory card, etc.), and then installing the programs in a general-purpose computer by using the external memory device 123. Also, a method of supplying a program to a computer is not limited to using the external memory device 123. For example, a program may be supplied to a computer using a communication means, e.g., the Internet or an exclusive line, without using the external memory device 123. The memory device 121c or the external memory device 123 may be configured as a non-transitory computer-readable recording medium. Hereinafter, the memory device 121 c and the external memory device 123 may also be referred to together simply as a "recording medium." Also, when the term "recording medium" is used in the present disclosure, it may be understood as only the memory device 121*c,* only the external memory device 123, or both the memory device 121*c* and the external memory device 123.

(2) Substrate Processing Process

Figure 4:
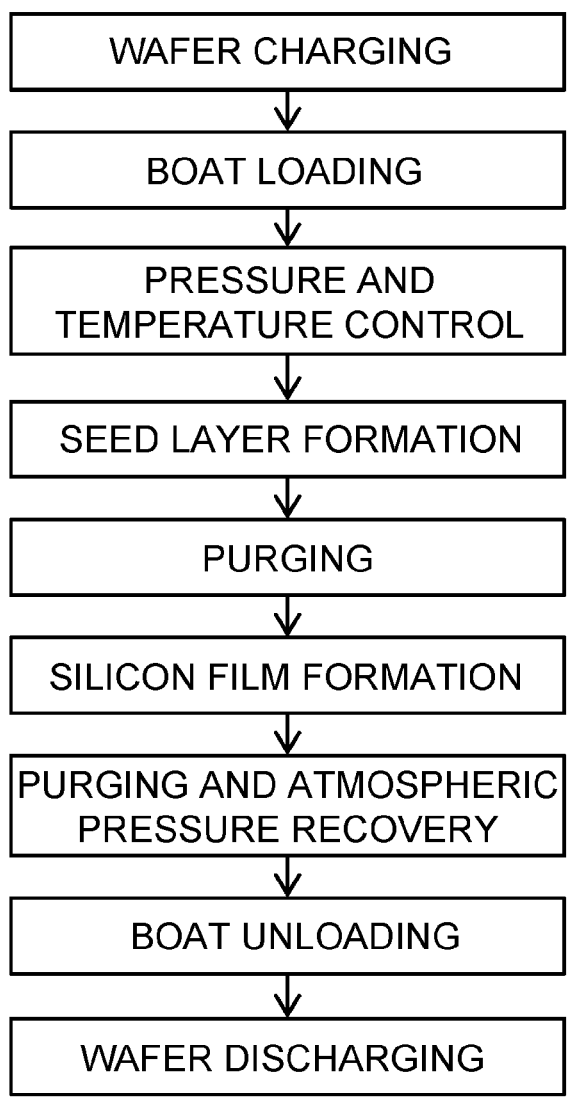
FIG. 4 is a flowchart of a film forming process in film forming sequences according to first to fifth embodiments of the present invention.

Next, an example of a sequence of forming a seed layer including a predetermined element and carbon on a substrate and forming a film containing the predetermined element on the seed layer using the process furnace of the substrate processing apparatus described above will be described as a process included in a process of manufacturing a semiconductor device (device) with reference to FIGS. 4 and 5 below. FIG. 4 is a flowchart of a film forming process in a film forming sequence according to the present embodiment. FIGS. 5A to 5C are diagrams illustrating gas supply timings in a film forming sequence according to the present embodiment of the present invention. In the following description, operations of various constitutional elements of the substrate processing apparatus are controlled by the controller 121.

In the film forming sequence according to the present embodiment, the following steps are performed: (a) forming a seed layer containing a predetermined element and carbon on a substrate by performing a cycle a predetermined number of times, the cycle including alternately performing supplying a first source gas containing the predetermined element, an alkyl group and a halogen group to the substrate and supplying a second source gas containing the predetermined element and an amino group to the substrate, or by performing supplying the first source gas to the substrate a predetermined number of times; and (b) forming a film containing the predetermined element on the seed layer by supplying a third source gas containing the predetermined element and free of the alkyl group to the substrate.

Here, "performing a cycle a predetermined number of times, the cycle including alternately performing supplying a first source gas and supplying a second source gas" includes performing the cycle including these processes once and performing the cycle a plurality of times. That is, it means performing the cycle at least once (a predetermined number of times). Also, "supplying the first source gas a predetermined number of times" includes performing a cycle including this process once and performing this cycle a plurality of times. That is, it means that this cycle is performed at least once (a predetermined number of times).

When the term "wafer" is used in the present disclosure, it should be understood as either the wafer itself, or both the wafer and a stacked structure (assembly) including a layer/film formed on the wafer (i.e., the wafer having the layer/film formed thereon may also be referred to collectively as the "wafer"). Also, when the expression "surface of the wafer" is used in the present disclosure, it should be understood as either a surface (exposed surface) of the wafer itself or a surface of a layer/film formed on the wafer, i.e., an uppermost surface of the wafer including a stacked structure.

Thus, in the present disclosure, the expression "specific gas is supplied to a wafer" should be understood to mean that the specific gas is directly supplied to a surface (exposed surface) of the wafer or that the specific gas is supplied to a surface of a layer/film on the wafer, i.e., on the uppermost surface of the wafer including a stacked structure. Also, in the present disclosure, the expression "a layer (or film) is formed on the wafer" should be understood to mean that the layer (or film) is directly formed on a surface (exposed surface) of the wafer itself or that the layer (or film) is formed on a layer/film on the wafer, i.e., on the uppermost surface of the wafer including the stacked structure.

Also, in the present disclosure, the term "substrate" has the same meaning as the term "wafer." Thus, the term "wafer" may be interchangeable with the term "substrate."

<First Sequence>

First, a first sequence according to the present embodiment will be described with reference to FIGS. 4 and 5A.

Figure 5A:
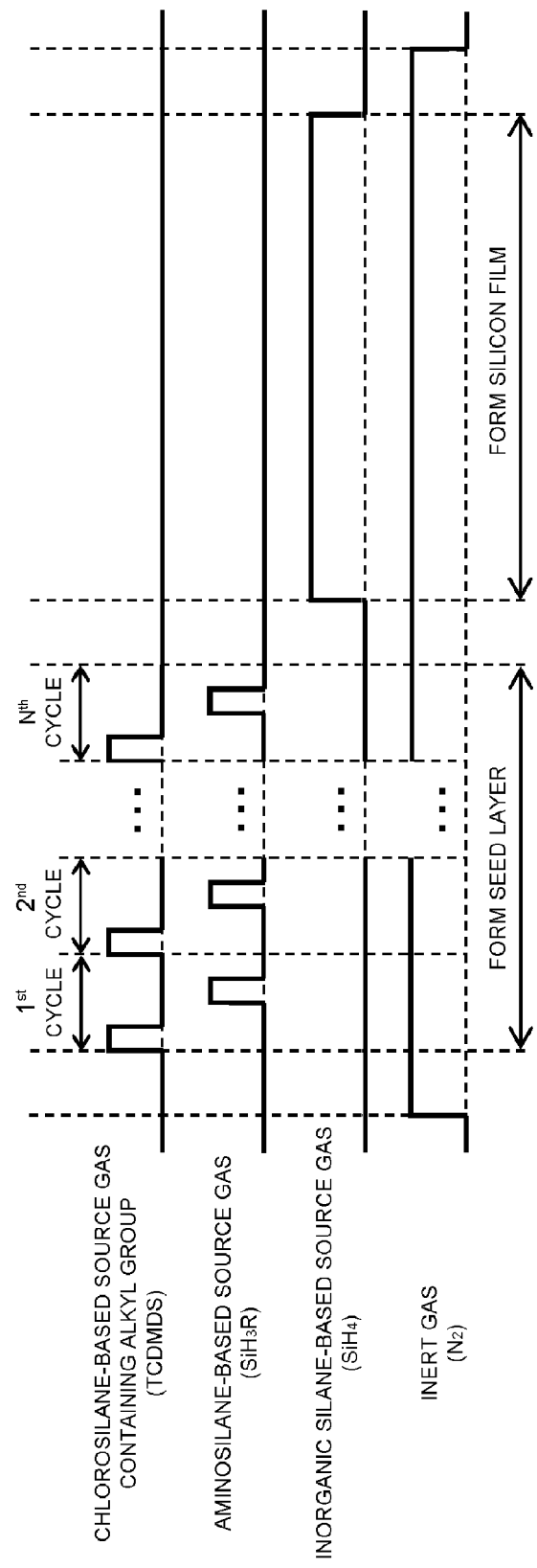

In the first sequence of FIG. 5A, a process of forming a seed layer containing silicon (Si) and carbon (C) on a wafer 200 which is a substrate by alternately performing a predetermined number of times a process of supplying TCDMDS gas which is a chlorosilane-based source gas containing an alkyl group as a first source to the wafer 200 and a process of supplying $SiH_3R$ gas which is an aminosilane-based source gas as a second source gas to the wafer 200; and a process of supplying $SiH_4$ gas which is an inorganic silane-based source gas as a third source gas to the wafer 200 to form a silicon film (Si film) containing a single element of silicon (Si) on the seed layer are performed.

The film forming sequence will now be described in detail.

(Wafer Charging and Boat Loading)

When a plurality of wafers 200 are placed in the boat 217 (wafer charging), the boat 217 supporting the plurality of wafers 200 is lifted by the boat elevator 115 and loaded into the process chamber 201 (boat loading), as illustrated in FIG. 1. In this state, the lower end of the reaction tube 203 is air-tightly closed by the seal cap 219 via the O-ring 220.

(Pressure & Temperature Control)

The inside of the process chamber 201 is vacuum-exhausted to have a desired pressure (degree of vacuum) by the vacuum pump 246. In this case, the pressure in the process chamber 201 is measured by the pressure sensor 245, and the APC valve 244 is feedback-controlled based on information regarding the measured pressure (pressure control). The vacuum pump 246 is kept operated at least until processing of the wafers 200 is completed. Also, the inside of the process chamber 201 is heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 begins by the rotating mechanism 267. The rotation of the boat 217 and the wafers 200 by the rotating mechanism 267 is also continuously performed at least until the processing of the wafers 200 is completed.

(Process of Forming a Seed Layer)

Thereafter, the following two steps, i.e., steps 1 and 2, are sequentially performed.

(Step 1: Supply of TCDMDS Gas)

TCDMDS gas is supplied to the first gas supply pipe 232*a* by opening the valve 243*a* of the first gas supply pipe 232*a.* The flow rate of the TCDMDS gas flowing through the first gas supply pipe 232*a* is adjusted by the MFC 241*a.* The TCDMDS gas, the flow rate of which is adjusted is supplied into the process chamber 201 via the gas supply holes 250*a* of the first nozzle 249*a* and exhausted via the exhaust pipe 231. In this case, the TCDMDS gas is supplied to the wafers 200. At the same time, the valve 243*f* is opened and an inert gas such as $N_2$ gas is supplied into the first inert gas supply pipe 232*f.* The flow rate of the $N_2$ gas flowing through the first inert gas supply pipe 232*f* is adjusted by the MFC 241*f.* The $N_2$ gas, the flow rate of which is adjusted is supplied into the process chamber 201 together with the TCDMDS gas and exhausted from the exhaust pipe 231. In this case, to prevent the TCD- MDS gas from flowing into the second nozzle 249b and the third nozzle 249c, the valves 243g and 243h are opened and $N_2$ gas is supplied into the second inert gas supply pipe 232g and the third inert gas supply pipe 232h. The $N_2$ gas is supplied into the process chamber 201 via the second gas supply pipe 232b, the third gas supply pipe 232c, the second nozzle 249b, and the third nozzle 249c, and exhausted from the exhaust pipe 231.

In this case, the pressure in the process chamber 201 is set to be within, for example, a range of 1 to 13,300 Pa, and preferably, a range of 20 to 1,330 Pa by appropriately controlling the APC valve 244. The supply flow rate of the TCDMDS gas controlled by the MFC 241a is set, for example, to be within a range of 100 to 10,000 sccm. A duration for which the TCDMDS gas is supplied to the wafers 200, i.e., a gas supply time (irradiation time), is set to range, for example, from 1 to 120 seconds and preferably, 1 to 60 seconds.

In this case, the temperature of the heater 207 is set such that the wafers 200 may have a temperature ranging from, for example, 250 to 700° C., preferably 300 to 650° C., and more preferably, 350 to 600° C. If the temperature of the wafer 200 is less than 250° C., it is difficult for the TCDMDS gas to be chemically adsorbed to the wafer 200 and a practical film-forming rate may thus not be achieved. This problem may be overcome when the temperature of the wafer 200 is controlled to be 250° C. or more. Also, when the temperature of the wafer 200 is controlled to be 300° C. or more or 350° C. or more, the TCDMDS gas may be sufficiently adsorbed to the wafer 200 and a more sufficient film forming rate can be achieved. Also, when the temperature of the wafer 200 is greater than 700° C., a chemical vapor deposition (CVD) reaction becomes stronger (gas-phase reaction is dominant), and film thickness uniformity is likely to be degraded and may thus be difficult to control. When the temperature of the wafer 200 is controlled to be 700° C. or less, the film thickness uniformity may be prevented from being degraded and be thus controlled. In particular, when the temperature of wafer 200 is controlled to be 650° C. or less or 600° C. or less, a surface reaction becomes dominant, and the film thickness uniformity may be easily achieved and be thus easily controlled. Thus, the temperature of the wafer 200 may be set to be within a range of 250 to 700° C., preferably, a range of 300 to 650° C., and more preferably, a range of 350 to 600° C.

Under the conditions described above, the TCDMDS gas is supplied to the wafer 200 to form a silicon-containing layer containing carbon (C) and chlorine (Cl) as a first layer on the wafer 200 (an underlying film formed on the wafer 200) to a thickness of less than one atomic layer to several atomic layers. The silicon-containing layer containing carbon (C) and chlorine (Cl) may include at least one of an adsorption layer of TCDMDS gas and a silicon (Si) layer containing carbon (C) and chlorine (Cl).

Here, the silicon layer containing carbon (C) and chlorine (Cl) generally refers to all layers including continuous layers formed of silicon (Si) and containing carbon (C) and chlorine (Cl), discontinuous layers formed of silicon (Si) and containing carbon (C) and chlorine (Cl), or a silicon thin film containing carbon (C) and chlorine (Cl) and formed by overlapping the continuous layers and the discontinuous layers. The continuous layers formed of silicon (Si) and containing carbon (C) and chlorine (Cl)) may also be referred to together as a silicon thin film containing carbon (C) and chlorine (Cl). Also, silicon (Si) used to form the silicon layer containing carbon (C) and chlorine (Cl) should be understood as including not only silicon (Si) from which a bond with carbon (C) or chlorine (Cl) is not completely broken but also silicon (Si) from which the bond with carbon (C) or chlorine (Cl) is completely broken.

Examples of the adsorption layer of TCDMDS gas include not only continuous chemical adsorption layers including gas molecules of TCDMDS gas but also discontinuous chemical adsorption layers including gas molecules of TCDMDS gas. That is, the adsorption layer of TCDMDS gas includes a chemical adsorption layer formed of TCDMDS molecules to a thickness of one or less than one molecular layer. Also, TCDMDS molecules of the adsorption layer of TCDMDS gas may have not only the chemical formula of FIG. 11A but also a chemical formula in which a bond between silicon (Si) and carbon (C) is partially broken and a chemical formula in which a bond between silicon (Si) and chlorine (Cl) is partially broken.

A layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer.

Silicon (Si) is deposited on the wafer 200 to form a silicon layer containing carbon (C) and chlorine (Cl) on the wafer 200 under condition where TCDMDS gas is self-decomposed (thermally decomposed), i.e., under condition causing a thermal decomposition of the TCDMDS gas. The TCDMDS gas is adsorbed to the wafer 200 to form an adsorption layer of TCDMDS gas on the wafer 200 under condition where TCDMDS gas is not self-decomposed (thermally decomposed), i.e., under condition that do not cause a thermal decomposition of the TCDMDS gas. A film-forming rate may be higher when the silicon layer containing carbon (C) and chlorine (Cl) is formed on the wafer 200 than when the adsorption layer of TCDMDS gas is formed on the wafer 200.

If the thickness of a silicon-containing layer containing carbon (C) and chlorine (Cl) and formed on the wafer 200 exceeds a thickness of several atomic layers, modification performed in step 2 which will be described below does not have an effect on the entire silicon-containing layer containing carbon (C) and chlorine (Cl). The silicon-containing layer containing carbon (C) and chlorine (Cl) that may be formed on the wafer 200 may have a minimum thickness of less than one atomic layer. Thus, the silicon-containing layer containing carbon (C) and chlorine (Cl) may be set to have a thickness of less than one atomic layer to several atomic layers. Also, the modification action performed in step 2 (which will be described below) may be relatively increased and a time required for the modification action in step 2 may be reduced by controlling the silicon-containing layer containing carbon (C) and chlorine (Cl) to have a thickness not more than one atomic layer, i.e., a thickness of less than one atomic layer or of one atomic layer. Also, a time required to form a silicon-containing layer containing carbon (C) and chlorine (Cl) in Step 1 may be reduced. Accordingly, a process time per cycle may be reduced and a process time to perform a total of cycles may thus be reduced. That is, a film-forming rate may be increased. Also, film thickness uniformity may be controlled to be increased by controlling the silicon-containing layer containing carbon (C) and chlorine (Cl) to have a thickness of one atomic layer or less.

(Removal of Remnant Gas)

After the silicon-containing layer containing carbon (C) and chlorine (Cl) is formed, the valve 243a of the first gas supply pipe 232a is closed and the supply of the TCDMDS gas is stopped. In this case, the inside of the process chamber 201 is vacuum-exhausted by the vacuum pump 246 while the APC valve 244 of the exhaust pipe 231 is open, thereby eliminating the TCDMDS gas (that does not react or that contributes to the formation of the first layer) remaining in the process chamber 201 from the process chamber 201. In this case, $N_2$ gas is continuously supplied as an inert gas into the process chamber 201 while the valves 243f, 243g, and 243h are open. The $N_2$ gas acts as a purge gas to increase the effect of eliminating the TCDMDS gas (that does not react or that contributes when the first layer is formed) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 2 to be performed thereafter will not be badly influenced by the gas. In this case, the flow rate of the $N_2$ gas to be supplied into the process chamber 201 need not be high. For example, the inside of the process chamber 201 may be purged without causing step 2 to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

Figure 11B:
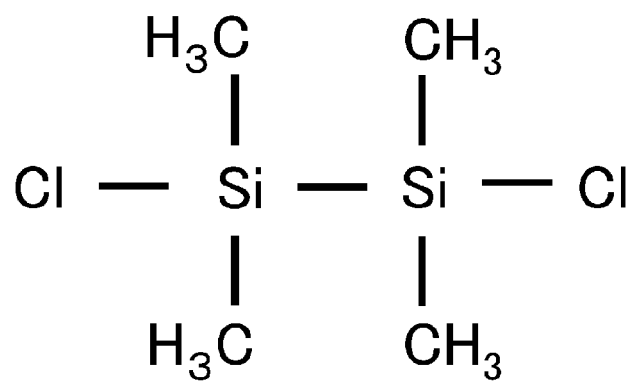
FIG. 11B illustrates a chemical formula of DCTMDS.

As a chlorosilane-based source gas containing an alkyl group, not only 1,1,2,2-tetrachloro-1,2-dimethyldisilane (abbreviated to: TCDMDS) gas but also 1,2-dichlorotetramethyldisilane (abbreviated to: DCTMDS) gas containing four alkyl groups ($CH_3$) and two chloro groups (Cl) in an empirical formula may be used. FIG. 11B illustrates a chemical formula of DCTMDS.

As the inert gas, not only $N_2$ gas but also a rare gas such as Ar gas, He gas, Ne gas, or Xe gas may be used.

(Step 2: Supply of $SiH_3R$ Gas)

After step 1 ends and the gas remaining in the process chamber 201 is eliminated, the valve 243b of the second gas supply pipe 232b is opened and $SiH_3R$ gas is supplied into the second gas supply pipe 232b. The flow rate of the $SiH_3R$ gas flowing in the second gas supply pipe 232b is adjusted by the MFC 241b. The $SiH_3R$ gas, the flow rate of which is adjusted is supplied from the gas supply holes 250b of the second nozzle 249b into the process chamber 201 and exhausted from the exhaust pipe 231. In this case, the $SiH_3R$ gas is supplied to the wafer 200. At the same time, the valve 243g is opened and $N_2$ gas is supplied as inert gas into the second inert gas supply pipe 232g. The flow rate of the $N_2$ gas flowing through the second inert gas supply pipe 232g is adjusted by the MFC 241g. The $N_2$ gas, the flow rate of which is adjusted is supplied into the process chamber 201 together with the $SiH_3R$ gas and exhausted from the exhaust pipe 231. In this case, in order to prevent the $SiH_3R$ gas from flowing into the first nozzle 249a and the third nozzle 249c, the valves 243f and 243h are opened and $N_2$ gas is supplied into the first inert gas supply pipe 232f and the third inert gas supply pipe 232h. The $N_2$ gas is supplied into the process chamber 201 via the first gas supply pipe 232a, the third gas supply pipe 232c, the first nozzle 249a, and the third nozzle 249c, and is then exhausted from the exhaust pipe 231.

In this case, the APC valve 244 is appropriately adjusted to set the pressure in the process chamber 201 to fall within a range of, for example, 1 to 13,300 Pa, preferably, a range of 20 to 1,330 Pa. The supply flow rate of the $SiH_3R$ gas controlled by the MFC 241b is set to fall within, for example, a range of 1 to 1,000 sccm. The supply flow rates of the $N_2$ gas controlled by the MFCs 241g, 241f, and 241h, respectively, are set to fall within, for example, a range of 100 to 10,000 sccm. A duration for which the $SiH_3R$ gas is supplied to the wafer 200, i.e., a gas supply time (irradiation time), is set to fall within, for example, a range of 1 to 120 seconds, and preferably, a range of 1 to 60 seconds.

In this case, the temperature of the heater 207 is set such that the temperature of the wafer 200 falls within, for example, a range of 300 to 700° C., preferably, 300 to 650° C., and more preferably, 350 to 600° C.

When the temperature of the wafer 200 is less than 300° C., the $SiH_3R$ gas supplied to the wafer 200 is difficult to be self-decomposed (thermally decomposed), thereby making it difficult to separate ligands (R) containing an amino group from silicon of the $SiH_3R$ gas. That is, a number of ligands (R) to react with the first layer, i.e., the silicon-containing layer containing carbon (C) and chlorine (Cl) formed in step 1, may be insufficient. As a result, it is difficult to cause an abstraction reaction of chlorine (Cl) atoms from the first layer, which will be described below, to occur. When the temperature of the wafer 200 is set to be 300° C. or more, the $SiH_3R$ gas supplied to the wafer 200 can be thermally decomposed easily, thereby enabling the ligands (R) containing an amino group to be easily separated from the silicon of the $SiH_3R$ gas. When the separated ligands (R) react with a halogen group (Cl) at the first layer, an abstraction reaction of the halogen group (Cl) from the first layer may easily occur. Also, when the temperature of the wafer 200 is set to 350° C. or more, the $SiH_3R$ gas supplied to the wafer 200 may thermally decomposed more actively and the number of ligands (R) to be separated from the silicon of the $SiH_3R$ gas may thus easily increase. Also, when the number of ligands (R) to react with chlorine (Cl) at the first layer increases, an abstraction reaction of the chlorine (Cl) from the first layer may more actively occur.

Also, as described above, an upper limit of temperatures that are desired in step 1 is 700° C. or less, preferably, 650° C. or less, and more preferably, 600° C. or less. In order to increase the throughput of the process of forming the seed layer by performing a cycle including steps 1 and 2 a predetermined number of times, the same temperature conditions may be set in steps 1 and 2. Thus, in steps 1 and 2, the temperature of the wafer 200 may be set to be within, for example, a range of 300 to 700° C., preferably, a range of 300 to 650° C., and more preferably, a range of 350 to 600° C. In this case, a modification process (modification of the first layer) in step 2 and the process (formation of the first layer) in step 1 may be individually and efficiently performed.

By supplying the $SiH_3R$ gas to the wafer 200 under the conditions described above, the first layer (silicon-containing layer containing carbon (C) and chlorine (Cl)) formed on the wafer 200 in step 1 and the $SiH_3R$ gas react with each other. That is, by supplying the $SiH_3R$ gas to the wafer 200 heated to the range of temperatures described above, ligands (R) containing an amino group are separated from the silicon of the $SiH_3R$ gas, and react with chlorine (Cl) atoms at the first layer, thereby abstracting the chlorine (Cl) from the first layer. Also, by heating the wafer 200 to the range of temperatures described above, the ligands (R) containing the amino group separated from the silicon of the $SiH_3R$ gas are prevented from binding with silicon that contains (unpaired) or has contained (has been unpaired) dangling bonds of the first layer (silicon-containing layer from which chlorine (Cl) is abstracted). Also, silicon containing dangling bonds when ligands (R) are separated from the $SiH_3R$ gas binds with silicon that contains or have contained dangling bonds of the first layer (silicon-containing layer from which chlorine (Cl) is abstracted), thereby forming a Si—Si bond. Thus, in step 1, the first layer (silicon-containing layer containing carbon (C)

and chlorine (Cl)) formed on the wafer 200 is changed (modified) into a second layer, i.e., a silicon layer that contains carbon (C) and an extremely low content of impurities such as chlorine (Cl) or nitrogen (N). Also, the second layer is a layer (Si layer containing carbon (C)) having a thickness of less than one atomic layer to several atomic layers and in which a predetermined amount (e.g., about 0.01 at % or more to 5 at % or less) of carbon (C) is added to a silicon layer (Si layer) containing a single element of silicon and having an extremely low content of impurities such as chlorine (Cl) or nitrogen (N). The crystal structure of the Si layer containing carbon (C) has an amorphous or polycrystalline state. The Si layer containing carbon (C) is also referred to as an amorphous silicon layer containing carbon (C) (a-Si layer containing carbon (C)) or a polysilicon layer containing carbon (C) (poly-Si layer containing carbon (C)).

When an Si layer containing carbon (C) is formed as the second layer, a most part of chlorine (Cl) of the first layer that has yet to be modified and a most part of the ligands (R) containing an amino group of the $SiH_3R$ gas react with each other to form a gas-phase reaction product, e.g., sodium amide, during the modification of the first layer using the $SiH_3R$ gas, and are then exhausted from the inside of the process chamber 201 via the exhaust pipe 231. Thus, the content of impurities such as chlorine (Cl) or nitrogen (N) in the result of modifying the first layer, i.e., the second layer, may decrease. Also, the content of carbon (C) in the Si layer containing carbon (C) may be appropriately controlled. Also, when $SiH_3R$ gas is used as the aminosilane-based source gas, the amount of an amino group included in the empirical formula (or one molecule) of the $SiH_3R$ gas is low, i.e., the content of carbon (C) or nitrogen (N) contained in the composition of the $SiH_3R$ gas is low. Thus, the content of carbon (C) in the result of modifying the first layer, i.e., the second layer, may be easily and appropriately controlled and the content of nitrogen (N) in the second layer may be greatly decreased.

(Removal of Remnant Gas)

After the second layer (Si layer containing carbon (C)) is formed, the valve 243b of the second gas supply pipe 232b is closed and the supply of the $SiH_3R$ gas is stopped. In this case, the inside of the process chamber 201 is vacuum-exhausted by the vacuum pump 246 while the APC valve 244 of the exhaust pipe 231 is open, thereby eliminating the $SiH_3R$ gas (that does not react or that contributes to the formation of the second layer) remaining in the process chamber 201 from the process chamber 201. In this case, $N_2$ gas is continuously supplied as an inert gas into the process chamber 201 while the valves 243f, 243g, and 243h are open. The $N_2$ gas acts as a purge gas to increase the effect of eliminating the $SiH_3R$ gas (that does not react or that contributes when the second layer is formed) or by-products remaining in the process chamber 201 from the process chamber 201.

In this case, the gas remaining in the process chamber 201 may not be completely eliminated and the inside of the process chamber 201 may not be completely purged. When a small amount of a gas remains in the process chamber 201, step 1 or a process of forming an Si film to be performed thereafter will not be badly influenced by the gas. In this case, the flow rate of the $N_2$ gas to be supplied into the process chamber 201 need not be high. For example, the inside of the process chamber 201 may be purged without causing step 1 or the process of forming an Si film to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the aminosilane-based source, not only monoaminosilane ($SiH_3R$) but also an organic source such as diaminosilane ($SiH_2RR'$), triaminosilane ($SiHRR'R''$), tetraaminosilane ($SiRR'R''R'''$) may be used. Here, R, R', R", and R'" each denote a ligand containing an amino group in which one or two hydrocarbon groups each including one nitrogen atom (N) and at least one carbon atom (C) coordinate [one or both sides of one "H" atom in an amino group expressed as $NH_2$ are substituted with a hydrocarbon group including one or more carbon (C) atoms]. When two hydrocarbon groups each of which is a part of the amino group coordinates with one nitrogen (N) atom, these hydrocarbon groups may be the same hydrocarbon group or different hydrocarbon groups. Also, the hydrocarbon group may include an unsaturated bond such as a double bond or a triple bond. Also, the amino groups represented by R, R', R", and R'" may be the same amino group or different amino groups. Also, the amino groups may have a ring-shaped structure. For example, bis-diethyl-amino-silane $(SiH_2[N(C_2H_5)_2]_2$, abbreviated to: BDEAS), bis-tertiary-butyl-amino-silane $(SiH_2[NH(C_4H_9)]_2$, abbreviated to: BTBAS), bis-diethyl-piperidino-silane $(SiH_2[NC_5H_8(C_2H_5)_2]_2$, abbreviated to: BDEPS), etc. may be used as $SiH_2RR'$. For example, tris-diethyl-amino-silane $(SiH[N(C_2H_5)_2]_3$, abbreviated to: 3DEAS), tris-dimethyl-amino-silane $(SiH[N(CH_3)_2]_3$, abbreviated to: 3DMAS), etc. may be used as $SiHRR'R''$. Also, for example, tetrakis-diethyl-amino-silane $(Si[N(C_2H_5)_2]_4$, abbreviated to: 4DEAS), tetrakis-dimethyl-amino-silane $(Si[N(CH_3)_2]_4$, abbreviated to: 4DMAS), etc. may be used as $SiRR'R''R'''$.

As the inert gas, not only $N_2$ gas but also a rare gas such as Ar gas, He gas, Ne gas, or Xe gas may be used.

(Performing of a Cycle a Predetermined Number of Times)

A seed layer containing silicon (Si) and carbon (C), i.e., a layer formed by adding a small amount of carbon (C) to an Si layer as a base, may be formed on the wafer 200 (underlying film formed on a surface of the wafer 200) by performing a cycle including steps 1 and 2 described above at least once (a predetermined number of times). In this case, the seed layer is a layer having an extremely low content of impurities such as chlorine (Cl) or nitrogen (N). The seed layer may be considered as an initial layer when an Si film (which will be described below) is formed on the wafer 200 (or the underlying film) or an interface layer formed at an interface between the wafer 200 (or the underlying film) and the Si film. The crystal structure of the seed layer is an amorphous state or a polycrystalline state. The seed layer may be referred to as an amorphous seed layer (a-seed film) or a poly-seed layer. The cycle described above is preferably performed a plurality of times. That is, a thickness of an Si layer containing carbon (C) to be formed per cycle may be set to be less than a desired thickness and the cycle may be performed a plurality of times until the Si layer may have the desired thickness.

Here, "when the cycle is repeatedly performed, a specific gas is supplied to the wafer 200 in each step after the cycle is performed at least twice" means "the specific gas is supplied on a layer formed on the wafer 200, i.e., on the uppermost surface of the wafer 200 as a stacked structure." "A specific layer is formed on the wafer 200" means "the specific layer is formed on a layer formed on the wafer 200, i.e., on the uppermost surface of the wafer 200 as a stacked structure. This has been described above, and also applies to other film forming sequences and other embodiments which will be described below.

The migration of Si atoms in an Si layer which is a base of the seed layer may be suppressed by adding a small amount of carbon (C) to the seed layer. That is, the migration of silicon (Si) in the seed layer may be suppressed and the nucleus density in the seed layer may increase. As a result, the diameters (grain size) of grains (crystal grains, non-crystal grains, etc.) of the seed layer may decrease. Also, when an Si film is formed on the seed layer in an Si film formation process which will be described below, the diameters (grain size) of grains (crystal grains, non-crystal grains, etc.) of the Si film may decrease. That is, the controllability of each of the grain size of the seed layer and the grain size of the Si film formed on the seed layer may be improved.

In addition, the thickness of the seed layer is preferably set to be greater than or equal to 0.1 nm and less than or equal to 1 nm (greater than or equal to 1 and less than or equal to 10 or less). When the seed layer is extremely thin, i.e., the thickness of the seed layer is less than 0.1 nm, it may be difficult to derive an effect of reducing the grain size of the Si film to be formed on the seed layer in the Si film formation process which will be described below. Also, there may be a variation in the grain size of the Si film formed on the seed layer in a plane of the wafer 200. That is, it is difficult to control the grain size of the Si film formed on the seed layer. When the seed layer is extremely thick, that is, when the thickness of the seed layer exceeds 1 nm, the function of the Si film formed on the seed layer may be influenced by the seed layer. For example, the resistance of an entire film formed by stacking the seed layer and the Si film may increase. That is, the function of the Si film may be degraded.

The concentration of carbon in the seed layer is preferably, for example, greater than or equal to 0.01 at % and less than or equal to 5 at %. When the concentration of carbon in the seed layer is extremely low, that is, when the concentration of carbon in the seed layer is less than 0.01 at %, an effect of suppressing the migration of Si atoms in the Si layer which is a base of the seed layer may be lowered. Also, an effect of suppressing the migration of silicon (Si) in the seed layer and increasing the nucleus density in the seed layer may be difficult to achieve. Also, the grain size of the seed layer may not be decreased. As a result, the grain size of the Si film to be formed on the seed layer may not be decreased. That is, the grain size of the Si film to be formed on the seed layer may be difficult to control. On the other hand, when the concentration of carbon in the seed layer is extremely high, that is, when the concentration of carbon in seed layer exceeds 5 at %, the function of the Si film formed on the seed layer may be influenced. For example, the resistance of an entire film formed by stacking the seed layer and the Si film may increase. That is, the function of the Si film may be degraded.

(Purging Process)

After the seed layer is formed on the wafer 200, the inside of the process chamber 201 is vacuum-exhausted by the vacuum pump 246 while the APC valve 244 of the exhaust pipe 231 is open, and a gas or by-products remaining in the process chamber 201 are eliminated from the process chamber 201. Also, in this case, $N_2$ gas is continuously supplied as an inert gas into the process chamber 201 while the valves 243f, 243g, and 243h are open. The $N_2$ gas acts as a purge gas to increase the effect of eliminating the gas or by-products remaining in the process chamber 201 from the process chamber 201.

In this case, the gas remaining in the process chamber 201 may not be completely eliminated and the inside of the process chamber 201 may not be completely purged. When a small amount of a gas remains in the process chamber 201, the process of forming an Si film to be performed thereafter will not be badly influenced by the gas. In this case, the flow rate of the $N_2$ gas to be supplied into the process chamber 201 need not be high. For example, the inside of the process chamber 201 may be purged without causing the process of forming an Si film in step 2 to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

In the first sequence, the removal of the remnant gas performed in step 2 of a final cycle in the process of forming a seed layer described above replaces the purging process. Thus, the purging process may be omitted in the first sequence.

(Process of Forming an Si Film)

After the seed layer is formed on the wafer 200 and the inside of the process chamber 201 is purged, an Si film is formed on the seed layer by CVD.

The valve 243c of the third gas supply pipe 232c is opened, and $SiH_4$ gas is supplied into the third gas supply pipe 232c. The flow rate of the $SiH_4$ gas flowing through the third gas supply pipe 232c is controlled by the MFC 241c. The $SiH_4$ gas, the flow rate of which is controlled is supplied into the process chamber 201 via the gas supply holes 250c of the third nozzle 249c and exhausted from the exhaust pipe 231. In this case, the $SiH_4$ gas is supplied to the wafer 200. At the same time, the valve 243h is opened and an inert gas such as $N_2$ gas is supplied into the third inert gas supply pipe 232h. The flow rate of the $N_2$ gas flowing through the third inert gas supply pipe 232h is controlled by the MFC 241h. The $N_2$ gas, the flow rate of which is controlled is supplied into the process chamber 201 together with the $SiH_4$ gas, and exhausted from the exhaust pipe 231. In this case, in order to prevent the $SiH_4$ gas from flowing into the first nozzle 249a and the second nozzle 249b, the valves 243f and 243g are opened, $N_2$ gas is supplied into the first inert gas supply pipe 232f and the second inert gas supply pipe 232g. The $N_2$ gas is supplied into the process chamber 201 via the first gas supply pipe 232a, the second gas supply pipe 232b, the first nozzle 249a, and the second nozzle 249b, and exhausted from the exhaust pipe 231.

In this case, the pressure in the process chamber 201 is set to be within, for example, a range of 1 to 13,300 Pa, and preferably, a range of 20 to 1,330 Pa by appropriately controlling the APC valve 244. The supply flow rate of the $SiH_4$ gas controlled by the MFC 241c is set, for example, to be within a range of 1 to 1,000 sccm. The supply flow rates of the $N_2$ gas controlled by the MFCs 241h, 241f, and 241g are set, for example, to be within a range of 100 to 10,000 sccm. A duration for which the $SiH_4$ gas is supplied to the wafer 200, i.e., a gas supply time (irradiation time), is set to range, for example, from 1 to 3,600 seconds, and preferably, 10 to 900 seconds. The temperature of the heater 207 is set such that the temperature of the wafer 200 ranges from, for example, 300 to 700° C., preferably, 300 to 650° C., and more preferably, 350 to 600° C., similar to that of the process of forming a seed layer.

An Si film containing a single element of silicon (Si) is formed on the seed layer by supplying $SiH_4$ gas to the wafer 200 under the conditions described above. Since the grain size of the seed layer decreases by adding a small amount of carbon (C) as described above, the Si film formed on the seed layer is influenced by the seed layer which is an underlying film and the grain size of the Si film also decreases. As a result, the function of the Si film may be improved. For example, the electrical resistivity of the Si film may be lowered. Also, when a silicon-containing gas that does not contain an alkyl group, and preferably, a silicon-containing gas that does not contain an amino group and a chloro group (i.e., a silane-based source gas that does not contain carbon (C), nitrogen (N), and chlorine (Cl)) is used as a third source gas, the Si film becomes a film having an extremely low content of impurities such as carbon (C), nitrogen (N), or chlorine (Cl).

Also, the thickness of the Si film formed on the seed layer is preferably, for example, greater than or equal to 30 nm and less than or equal to 100 nm. That is, a thickness T (nm) of the Si film formed on the seed layer is preferably far thicker than a thickness Ts (nm) of the seed layer, and is preferably set to satisfy a relation of T>>Ts. When the thicknesses of the Si film and the seed layer are set to satisfy the relation of T>>Ts, the resistance of an entire film formed by stacking the seed layer and the Si film may be prevented from increasing. That is, the function of the Si film may be prevented from being degraded.

As the third source gas containing silicon (Si) and free of alkyl group, not only monosilane ($SiH_4$, abbreviated to: MS) gas but also disilane ($Si_2H_6$, abbreviated to: DS) gas, polysilane [$Si_nH_{2n+2}(n>2)$] gas (e.g., trisilane ($Si_3H_8$, abbreviated to: TS) gas), and an inorganic silane-based gas (e.g., monochlorosilane ($SiH_3Cl$, abbreviated to: MCS) gas, dichlorosilane ($SiH_2Cl_2$, abbreviated to: TCDMDS) gas, hexachlorodisilane ($Si_2Cl_6$, abbreviated to: HCDS) gas, tetrachlorosilane ($SiCl_4$, abbreviated to: STC) gas, and trichlorosilane ($SiHCl_3$, abbreviated to: TCS) gas) may be used. Also, the polysilane gas may also be referred to as an inorganic silane-based gas free of chloro group.

As the inert gas, not only the $N_2$ gas but also a rare gas such as Ar gas, He gas, Ne gas, or Xe gas may be used.

(Purging and Atmospheric Pressure Recovery)

After the Si film is formed on the seed layer to a desired thickness, the valves 243f, 243g, and 243h are opened, and $N_2$ gas is supplied as an inert gas into the process chamber 201 via the first inert gas supply pipe 232f, the second inert gas supply pipe 232g, and the third inert gas supply pipe 232h and is then exhausted from the exhaust pipe 231. The $N_2$ gas acts as a purge gas, and thus the inside of the process chamber 201 is purged with an inert gas, thereby eliminating a gas or by-products remaining in the process chamber 201 from the process chamber 201 (purging). Thereafter, an atmosphere in the process chamber 201 is replaced with the inert gas (inert gas replacement), and the pressure in the process chamber 201 is recovered to normal pressure (atmospheric pressure recovery).

(Boat Unloading and Wafer Discharging)

Then, the seal cap 219 is moved downward by the boat elevator 115 to open the lower end of the reaction tube 203, and the processed wafers 200 are unloaded to an outside of the reaction tube 203 from the lower end of the reaction tube 203 while being supported by the boat 217 (boat unloading). Thereafter, the processed wafers 200 are unloaded from the boat 217 (wafer discharging).

<Second Sequence>

Next, the second sequence according to the present embodiment will be described with reference to FIGS. 4 and 5B.

In the second sequence of FIG. 5B, a process of forming a seed layer containing silicon (Si) and carbon (C) on the wafer 200 which is a substrate by performing only a process of supplying TCDMDS gas (which is a chlorosilane-based source gas containing an alkyl group) as a first source gas to the wafer 200 a predetermined number of times (once), and a process of forming an Si film containing a single element of silicon (Si) on the seed layer by supplying $SiH_4$ gas (which is an inorganic silane-based source gas) as a third source gas to the wafer 200 are performed.

That is, the second sequence is different from the first sequence of FIG. 5A in that a seed layer is formed by individually performing the process of supplying TCDMDS gas once, i.e., continuously once, and is performed in the same process order and according to the same process conditions as in the first sequence. A process of forming a seed layer in the second sequence will now be described.

(Process of Forming a Seed Layer: Supply of TCDMDS Gas)

TCDMDS gas is supplied to the wafer 200 in the process chamber 201 in the same process order as in the process of forming the seed layer in the first sequence. Here, process conditions under which the TCDMDS gas is supplied to the wafer 200 are conditions that fall within the ranges of conditions described above with respect to the process of forming the seed layer in the first sequence, and conditions under which the TCDMDS gas supplied to the wafer 200 is self-decomposed (thermally decomposed), i.e., conditions causing a thermal decomposition of the TCDMDS gas to occur. Also, a duration for which the TCDMDS gas is supplied (irradiation time) is set to fall within, for example, a range of 1 to 3,600 seconds, and preferably, a range of 10 to 900 seconds.

Under the conditions described above, a seed layer containing silicon (Si) and carbon (C), i.e., a layer formed by adding a small amount of carbon (C) to an Si layer as a base, may be formed on the wafer 200 (underlying film formed on a surface of the wafer 200) by supplying TCDMDS gas to the wafer 200. Also, when the seed layer is formed, chlorine (Cl) or hydrogen (H) contained in the TCDMDS gas forms a gas-phase reaction product, such as chlorine ($Cl_2$) gas, hydrogen ($H_2$) gas, or hydrogen chloride (HCl) gas, during a thermal decomposition of the TCDMDS gas, and is then exhausted from the process chamber 201 via the exhaust pipe 231. Also, the TCDMDS gas used to form the seed layer is a gas that does not contain nitrogen (N) in an empirical formula. As a result, the seed layer becomes a layer having an extremely low content of impurities such as chlorine (Cl) or nitrogen (N). Also, the crystal structure of the seed layer has an amorphous state or a polycrystalline sate, as in the first sequence.

The thickness of the seed layer is preferably, for example, greater than or equal to 0.1 nm and less than or equal to 1 nm (greater than or equal to 1 and less than or equal to 10), and the concentration of carbon in the seed layer is preferably, for example, greater than or equal to 0.01 at % and less than or equal to 5 at %, similar to the first sequence.

(Purging Process)

After the seed layer is formed on the wafer 200, the valve 243a of the first gas supply pipe 232a is closed and the supply of the TCDMDS gas is stopped. Then, the TCDMDS gas (that does not react or that contributes to the formation of the seed layer) remaining in the process chamber 201 is eliminated from the process chamber 201, and the inside of the process chamber 201 is purged in the same process order as in the purging process of the first sequence. In this case, the gas remaining in the process chamber 201 may not be completely eliminated and the inside of the process chamber 201 may not be completely purged, similar to the first sequence.

(Process of Forming an Si Film)

After the seed layer is formed on the wafer 200 and the inside of the process chamber 201 is purged, an Si film is formed on the seed layer, for example, to a thickness that is greater than or equal to 30 nm and less than or equal to 100 nm in the same process order and according to the same process conditions as in the process of forming an Si film in the first sequence.

In the second sequence, the effects similar to those when the first sequence is performed may be also achieved. That is, the migration of Si atoms in an Si layer which is a base of the seed layer may be suppressed by adding a small amount of carbon (C) to the seed layer. As a result, the grain size of the seed layer and the grain size of the Si film formed on the seed layer may decrease.

<Third Sequence>

Next, the third sequence according to the present embodiment will be described with reference to FIGS. 4 and 5C.

In the third sequence of FIG. 5C, a process of forming a seed layer containing silicon (Si) and carbon (C) on the wafer 200 which is a substrate by performing only a process of supplying TCDMDS gas (which is a chlorosilane-based source gas containing an alkyl group) as a first source gas to the wafer 200 a predetermined number of times (a plurality of times), and a process of forming an Si film containing a single element of silicon (Si) on the seed layer by supplying $SiH_4$ gas (which is an inorganic silane-based source gas) as a third source gas to the wafer 200 are performed.

That is, the third sequence is different from the first sequence of FIG. 5A in that a seed layer is formed by individually performing the process of supplying TCDMDS gas a plurality of times, i.e., intermittently a plurality of times, and is performed in the same process order and according to the same process conditions as in the first sequence. A process of forming a seed layer in the third sequence will now be described.

(Process of Forming a Seed Layer: Supply of TCDMDS Gas)

TCDMDS gas is supplied to the wafer 200 in the process chamber 201 in the same process order as in the process of forming the seed layer in the first sequence. Here, process conditions under which the TCDMDS gas is supplied to the wafer 200 are conditions that fall within the ranges of conditions described above with respect to the process of forming the seed layer in the first sequence, and conditions under which the TCDMDS gas supplied to the wafer 200 is self-decomposed (thermally decomposed), i.e., conditions causing a thermal decomposition of the TCDMDS gas to occur. Also, a duration for which the TCDMDS gas is supplied (irradiation time) is set to fall within, for example, a range of 1 to 120 seconds, and preferably, a range of 1 to 60 seconds.

Under the conditions described above, an Si layer containing carbon (C) may be formed on the wafer 200 (underlying film formed on a surface of the wafer 200) by supplying TCDMDS gas to the wafer 200. Also, when the Si layer containing carbon (C) is formed, chlorine (Cl) or hydrogen (H) contained in the TCDMDS gas forms a gas-phase reaction product, such as chlorine ($Cl_2$) gas, hydrogen ($H_2$) gas, or hydrogen chloride (HCl) gas, during a thermal decomposition of the TCDMDS gas, and is then exhausted from the process chamber 201 via the exhaust pipe 231. Also, the TCDMDS gas used to form the Si layer containing carbon (C) is a gas that does not contain nitrogen (N) in an empirical formula. As a result, the Si layer containing carbon (C) becomes a layer having an extremely low content of impurities such as chlorine (Cl) or nitrogen (N). Also, the crystal structure of the Si layer containing carbon (C) has an amorphous state or a polycrystalline sate, as in the first sequence.

(Removal of Remnant Gas)

After the Si layer containing carbon (C) is formed on the wafer 200, the TCDMDS gas (that does not react or that contributes to the formation of the Si layer containing carbon (C)) remaining in the process chamber 201 is eliminated from the process chamber 201, and the inside of the process chamber 201 is purged in the same process order as in the step 1 of the first sequence. In this case, the gas remaining in the process chamber 201 may not be completely eliminated and the inside of the process chamber 201 may not be completely purged, similar to the first sequence. Also, the Si layer containing carbon (C) formed on the wafer 200 is annealed (thermally treated) at a predetermined temperature for a predetermined time when the inside of the process chamber 201 is purged. The thermal treatment promotes elimination of impurities such as chlorine (Cl) from the Si layer containing carbon (C), thereby greatly reducing the amount of impurities such as chlorine (Cl) in the Si layer containing carbon (C).

(Performing of a Cycle a Predetermined Number of Times)

A seed layer containing silicon (Si) and carbon (C) (i.e., a layer formed by adding a small amount of carbon (C) to an Si layer as a base) may be formed on the wafer 200 (underlying film on a surface of the wafer 200) by performing a plurality of times (n times) a cycle including the supplying of the TCDMDS gas into the process chamber 201 and the purging of the inside of the process chamber 201. Thus, the seed layer is a layer having an extremely low content of impurities such as chlorine (Cl) or nitrogen (N).

In addition, the thickness of the seed layer is preferably set to be greater than or equal to 0.1 nm and less than or equal to 1 nm (greater than or equal to 1 and less than or equal to 10) and the concentration of carbon in the seed layer is preferably set to be greater than or equal to 0.01 at % and less than or equal to 5 at %, as in the first sequence.

(Purging Process)

After the seed layer is formed on the wafer 200, the TCDMDS gas (that does not react or that contributes to the formation of the seed layer) remaining in the process chamber 201 is eliminated from the process chamber 201 and the inside of the process chamber 201 is purged in the same process order as in the purging process of the first sequence. In this case, the gas remaining in the process chamber 201 may not be completely eliminated, the inside of the process chamber 201 may not be completely purged, and the purging process may be omitted, similar to the first sequence.

(Process of Forming an Si Film)

After the seed layer is formed on the wafer 200 and the inside of the process chamber 201 is purged, an Si film is formed on the seed layer, for example, to a thickness that is greater than or equal to 30 nm and less than or equal to 100 nm in the same process order and according to the same process conditions as in the process of forming an Si film in the first sequence.

In the third sequence, the effects similar to those when the first sequence is performed may be also achieved. That is, the migration of Si atoms in an Si layer which is a base of the seed layer may be suppressed by adding a small amount of carbon (C) to the seed layer. As a result, the grain size of the seed layer and the grain size of the Si film formed on the seed layer may decrease.

(3) Effects of the Present Embodiment

According to the present embodiment, one or more effects which will be described below can be achieved.

(a) According to the present embodiment, film thickness uniformity of an Si film in a plane of the wafer 200 may be improved by forming a seed layer before the Si film is formed on the wafer 200. If the Si film is formed directly on the wafer 200 by CVD, silicon (Si) may be grown on the wafer 200 during an initial growth stage of the silicon (Si) and the film thickness uniformity of the Si film in the plane of the wafer 200 may be thus lowered. The problem may be solved by forming the seed layer as an initial layer on the wafer 200 beforehand. Also, a film forming rate of the Si film may be improved since the Si film is formed by CVD rather than an alternate supply method.

(b) According to the present embodiment, the migration of silicon (Si) atoms in an Si layer that is a base of the seed layer may be suppressed by supplying a small amount of carbon (C) to the seed layer. That is, the migration of silicon (Si) atoms in the seed layer may be suppressed and the nucleus density in the seed layer may be increased. As a result, the grain size of the seed layer and the grain size of the Si film formed on the seed layer may decrease. That is, the controllability of each of the grain size of the seed layer and the grain size of the Si film formed on the seed layer may be improved. Thus, the function of the Si film may be improved. For example, the electric resistivity of the Si film may decrease.

(c) According to the present embodiment, when the seed layer is formed, carbon (C) that is needed to control the grain size of the Si film may be efficiently introduced into the seed layer by using a chlorosilane-based source gas including an alkyl group as a first source gas. In particular, carbon (C) may be efficiently introduced into the seed layer by using TCDMDS gas or DCTMDS gas, which includes a plurality of alkyl groups and a plurality of chloro groups in an empirical formula (in one molecule), as the first source gas. Thus, the controllability of each of the grain size of the seed layer and the grain size of the Si film formed on the seed layer may be easily improved.

(d) According to the present embodiment, the seed layer may be formed as a layer having an extremely low content of impurities such as chlorine (Cl) or nitrogen (N). Thus, the function of an entire film formed by stacking the seed layer and the Si film may be improved.

That is, in the first sequence, when an Si layer containing carbon (C) is formed as a second layer, most parts of chlorine (Cl) contained in a first layer that has yet to be modified and a ligand (R) including an amino group contained in $SiH_3R$ gas react with each other to form a gas-phase reaction product, for example, sodium amide during the modification of the first layer using the $SiH_3R$ gas, and the chlorine (Cl) and the ligand (R) are then exhausted from the process chamber 201. Thus, the amount of impurities such as chlorine (Cl) or nitrogen (N) contained in the result of modifying the first layer, i.e., the second layer (Si layer containing carbon (C)), may be lowered. In particular, in the first sequence, a process of supplying TCDMDS gas is individually performed a predetermined number of times to efficiently lower the amount of chlorine (Cl) in the seed layer, compared to the second and third sequences of forming a seed layer. Also, in the first sequence, $SiH_3R$ gas in which the number of amino groups is small (one amino group is included) in an empirical formula (in one molecule) is used as a second source gas and the amount of nitrogen (N) in the second layer (Si layer containing carbon (C)) may be thus greatly reduced. Accordingly, the seed layer may be formed as a layer having an extremely low content of impurities such as chlorine (Cl) or nitrogen (N), and the function of an entire film formed by stacking the seed layer and the Si film may be improved.

Also, in the second and third sequences, chlorine (Cl) or hydrogen (H) contained in TCDMDS gas forms a gas-phase reaction product, such as $Cl_2$ gas, $H_2$ gas, or HCl gas, during a thermal decomposition of the TCDMDS gas, and is then exhausted from the process chamber 201, when the seed layer is formed. Also, the TCDMDS gas used to form the seed layer does not contain nitrogen (N) in an empirical formula. Thus, the seed layer may be formed as a layer having an extremely low content of impurities such as chlorine (Cl) or nitrogen (N), and the function of an entire film formed by stacking the seed layer and the Si film may be improved.

Also, in the third sequence, the amount of chlorine (Cl) contained in the seed layer may be easily reduced, compared to the second sequence. That is, in the third sequence, an Si layer containing carbon (C) is formed by supplying TCDMDS gas to the wafer 200, and the inside of the process chamber 201 is purged by suspending the supply of the TCDMDS gas into the process chamber 201. In this case, the Si layer containing carbon (C) is annealed (thermally treated) at a predetermined temperature for a predetermined time. The thermal treatment promotes elimination of impurities such as chlorine (Cl) from the Si layer containing carbon (C), thereby greatly reducing the amount of impurities such as chlorine (Cl) in the seed layer. Accordingly, the seed layer may be formed as a layer having an extremely low content of impurities such as chlorine (Cl), and the function of an entire film formed by stacking the seed layer and the Si film may be improved.

(d) According to the present embodiment, the controllability of the step coverage characteristics or film thickness of the seed layer, i.e., a film formed by stacking the seed layer and the Si film, may be increased.

That is, in the first sequence, an alternate supply method of alternately supplying TCDMDS gas and $SiH_3R$ gas to the wafer 200 is used to appropriately cause a reaction to occur under condition where surface reactions are dominant, and the step coverage of the seed layer may be improved. Also, the controllability of the thickness of the seed layer may be increased. Thus, the controllability of the step coverage or film thickness of an entire film formed by stacking the seed layer and the Si film may be increased.

Also, in the third sequence, an intermittent supply method of intermittently supplying TCDMDS gas to the wafer 200 is used to appropriately control a film forming rate and improve the step coverage of the seed layer, compared to the second sequence using a continuous supply method. Also, the controllability of the film thickness of the seed layer may be increased. Thus, the controllability of the step coverage or film thickness of an entire film formed by stacking the seed layer and the Si film may be increased.

(e) According to the present embodiment, a film forming rate of the seed layer, i.e., an entire film formed by stacking the seed layer and the Si film, may be increased.

That is, according to the present embodiment, chlorine (Cl) as a halogen group (chloro group) included in TCDMDS gas may promote the TCDMDS gas to be adsorbed to the wafer 200 or silicon (Si) to be deposited on the wafer 200. Thus, in the first sequence, a film forming rate of the first layer (silicon-containing layer containing carbon (C) and chlorine (Cl)) formed on the wafer 200 in step 1 may be improved. In the second sequence, a film forming rate of the seed layer containing silicon (Si) and carbon (C) formed on the wafer 200 may be improved. In the third sequence, a film forming rate of the first layer (silicon-containing layer containing carbon (C) and chlorine (Cl)) formed on the wafer 200 in step 1 may be improved. That is, in all the first to third sequences, the speed of forming the seed layer on the wafer 200 (film forming rate of the seed layer) may be improved due to an action of chlorine (Cl) in the TCDMDS gas. Thus, a film forming rate of an entire film formed by stacking the seed layer and the Si film may be easily increased.

(f) In the second and third sequences according to the present embodiment, only TCDMDS gas is supplied into the process chamber 201 and $SiH_3R$ gas is not supplied into the process chamber 201 when the seed layer is formed. That is, an aminosilane-based source gas supply system need not be installed as a second source gas supply system into the substrate processing apparatus 100. Therefore, the substrate processing apparatus 100 may be simplified in a structure and manufactured at low costs.

Second Embodiment of the Present Invention

In the first embodiment described above, a case in which a seed layer is formed on the wafer 200 by alternately performing a predetermined number of times the process of supplying TCDMDS gas to the wafer 200 and the process of supplying SiH$_3$R gas to the wafer 200 or by performing only the process of supplying TCDMDS gas a predetermined number of times has been described. However, the present invention is not limited thereto.

That is, as in a film forming sequence illustrated in FIG. 6, when TCDMDS gas is supplied to the wafer 200, for example, SiH$_4$ gas which is an inorganic silane-based source gas may be supplied as a gas containing a predetermined element (silicon in this case) together with the TCDMDS gas. In other words, the SiH$_4$ gas may be added to the TCDMDS gas to be supplied to the wafer 200.

In detail, as in a first sequence illustrated in FIG. 6A, a seed layer containing silicon (Si) and carbon (C) may be formed on the wafer 200 by alternately performing a predetermined number of times (at least once) a process of supplying TCDMDS gas and SiH$_4$ gas to the wafer 200 and a process of supplying SiH$_3$R gas to the wafer 200. Otherwise, as in a second sequence illustrated in FIG. 6B, a seed layer containing silicon (Si) and carbon (C) may be formed on the wafer 200 by individually performing a process of supplying TCDMDS gas and SiH$_4$ gas to the wafer 200 once (continuously). Otherwise, as in a third sequence illustrated in FIG. 6C, a seed layer containing silicon (Si) and carbon (C) may be formed on the wafer 200 by individually performing the process of supplying TCDMDS gas and SiH$_4$ gas to the wafer 200 a plurality of times (intermittently).

To supply TCDMDS gas and SiH$_4$ gas to the wafer 200, the valve 243$c$ of the third gas supply pipe 232$c$ is opened and SiH$_4$ gas is supplied into the third gas supply pipe 232$c$ when the TCDMDS gas is supplied into the process chamber 201. The flow rate of the SiH$_4$ gas flowing through the third gas supply pipe 232$c$ is controlled by the MFC 241$c$. The SiH$_4$ gas, the flow rate of which is controlled is supplied into the process chamber 201 via the gas supply holes 250$c$ of the third nozzle 249$c$, and exhausted from the exhaust pipe 231. Thus, the TCDMDS gas and the SiH$_4$ gas, i.e., the SiH$_4$ gas-added TCDMDS gas is supplied to the wafer 200.

In the first to third sequences illustrated in FIG. 6A to 6C, the TCDMDS gas and the SiH$_4$ gas may not be simultaneously supplied to the wafer 200 and may be alternately supplied to the wafer 200 a predetermined number of times (at least once). Also, in the first sequence of FIG. 6A, SiH$_4$ gas may be added to not only TCDMDS gas but also SiH$_3$R gas. In this case, SiH$_3$R gas and SiH$_4$ gas may not be simultaneously supplied to the wafer 200 and may be alternately supplied to the wafer 200 a predetermined number of times (at least once).

In the second embodiment, the effects similar to those when the first embodiment is performed may also be achieved.

Also, according to the second embodiment, the controllability of the concentration of carbon in a seed layer may be easily increased by adjusting the flow rate of SiH$_4$ gas to be added to TCDMDS gas or SiH$_3$R gas. For example, the concentration of carbon in the seed layer may be lowered by adjusting the flow rate of SiH$_4$ gas to be added to TCDMDS gas or SiH$_3$R gas. Also, the concentration of carbon in the seed layer may be suppressed from decreasing by decreasing the flow rate of SiH$_4$ gas to be added to TCDMDS gas or SiH$_3$R gas. As a result, the controllability of the diameters of grains of the seed layer, i.e., the diameters of grains of the Si film formed on the seed layer may be easily greatly improved.

Also, as a silicon-containing gas to be added to TCDMDS gas or SiH$_3$R gas, an inorganic silane-based source gas (such as MS gas, DS gas, TS gas, MCS gas, DCS gas, HCDS gas, STC gas, and TCS gas), or an aminosilane-based source gas (such as 3DMAS gas, BTBAS gas, BDEPS gas, 3DEAS gas, 4DEAS gas, and 4DMAS gas) may be used. When a gas that does not contain an amino group, i.e., nitrogen (N), is used among these gases, the amount of nitrogen (N) in the seed layer may be lowered, and the function of an entire film formed by stacking the seed layer and the Si film may be improved.

Third Embodiment of the Present Invention

In the first embodiment described above, a case in which a seed layer is formed on the wafer 200 by alternately performing a predetermined number of times the process of supplying TCDMDS gas to the wafer 200 and the process of supplying SiH$_3$R gas to the wafer 200 or by performing only the process of supplying TCDMDS gas a predetermined number of times has been described. However, the present invention is not limited thereto.

That is, as in a film forming sequence illustrated in FIG. 7, when TCDMDS gas is supplied to the wafer 200, for example, C$_3$H$_6$ gas may be supplied as a carbon-containing gas together with the TCDMDS gas. In other words, the C$_3$H$_6$ gas may be added to the TCDMDS gas to be supplied to the wafer 200.

Figure 7B:
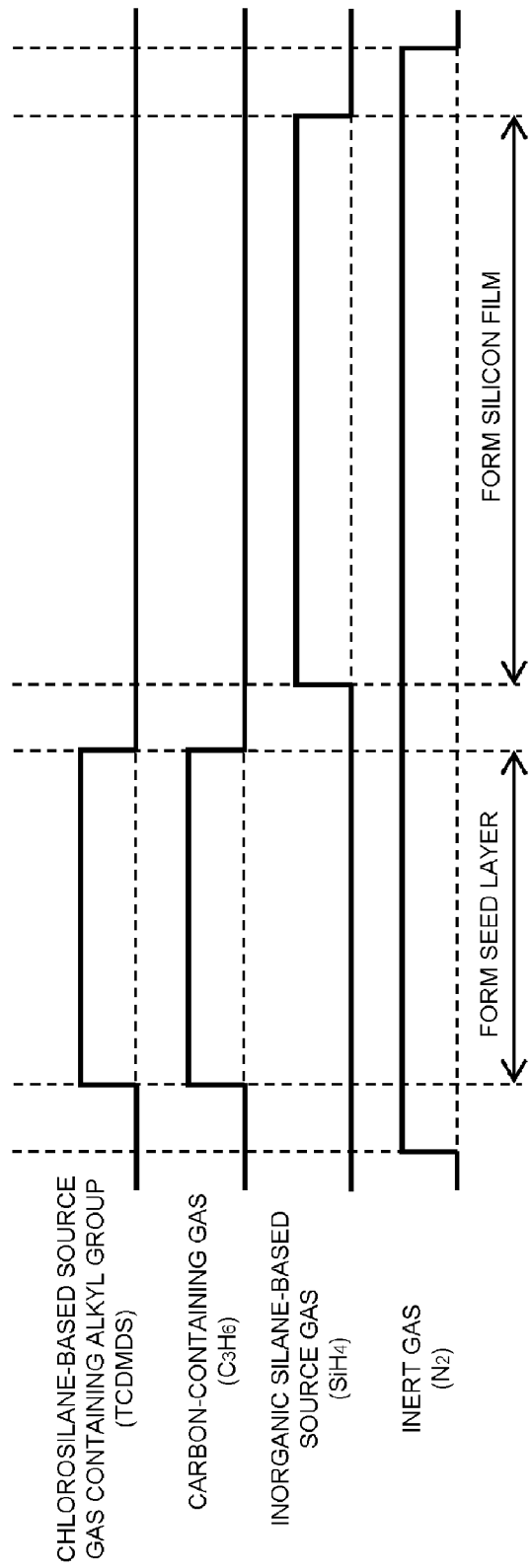

In detail, as in a first sequence illustrated in FIG. 7A, a seed layer containing silicon (Si) and carbon (C) may be formed on the wafer 200 by alternately performing a predetermined number of times (at least once) a process of supplying TCDMDS gas and C$_3$H$_6$ gas to the wafer 200 and a process of supplying SiH$_3$R gas to the wafer 200. Otherwise, as in a second sequence illustrated in FIG. 7B, a seed layer containing silicon (Si) and carbon (C) may be formed on the wafer 200 by individually performing a process of supplying TCDMDS gas and C$_3$H$_6$ gas to the wafer 200 once (continuously). Otherwise, as in a third sequence illustrated in FIG. 7C, a seed layer containing silicon (Si) and carbon (C) may be formed on the wafer 200 by individually performing the process of supplying TCDMDS gas and C$_3$H$_6$ gas to the wafer 200 a plurality of times (intermittently).

To supply TCDMDS gas and C$_3$H$_6$ gas to the wafer 200, the valve 243$d$ of the fourth gas supply pipe 232$d$ is opened and C$_3$H$_6$ gas is supplied into the fourth gas supply pipe 232$d$ when the TCDMDS gas is supplied into the process chamber 201. The flow rate of the C$_3$H$_6$ gas flowing through the fourth gas supply pipe 232$d$ is controlled by the MFC 241$d$. The C$_3$H$_6$ gas, the flow rate of which is controlled is supplied into the process chamber 201 from the gas supply holes 250$c$ of the third nozzle 249$c$ via the third gas supply pipe 232$c$, and exhausted from the exhaust pipe 231. Thus, the TCDMDS gas and the C$_3$H$_6$ gas, i.e., the C$_3$H$_6$ gas-added TCDMDS gas is supplied to the wafer 200.

Figure 7C:
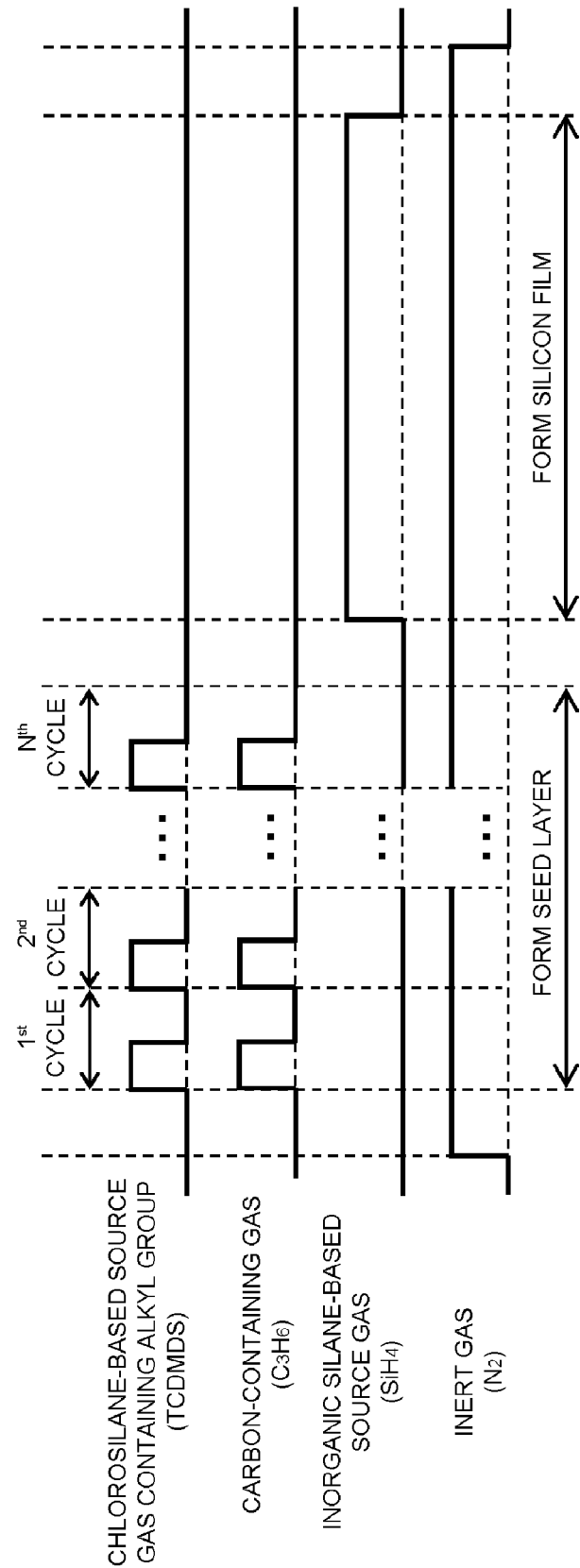

In the first to third sequences illustrated in FIGS. 7A to 7C, the TCDMDS gas and the C$_3$H$_6$ gas may not be simultaneously supplied to the wafer 200 and may be alternately supplied to the wafer 200 a predetermined number of times (at least once). Also, in the first sequence of FIG. 7A, C$_3$H$_6$ gas may be added to not only TCDMDS gas but also SiH$_3$R gas.

In this case, SiH$_3$R gas and C$_3$H$_6$ gas may not be simultaneously supplied to the wafer 200 and may be alternately supplied to the wafer 200 a predetermined number of times (at least once).

In the third embodiment, the effects similar to those when the first embodiment is performed may also be achieved.

Also, according to the third embodiment, the concentration of carbon in a seed layer may be greatly increased by adding C$_3$H$_6$ gas to TCDMDS gas or SiH$_3$R gas. Thus, the migration of Si atoms in the Si layer which is a base of the seed layer may be more securely suppressed and the grain size of the seed layer may be greatly reduced. That is, the grain size of the Si film formed on the seed layer may be greatly reduced. That is, the controllability of the diameters of the grains of the Si film may be improved Also, according to the third embodiment, the concentration of carbon in the seed layer may be easily controlled by adjusting the flow rate of C$_3$H$_6$ gas to be added to TCDMDS gas or SiH$_3$R gas. For example, the concentration of carbon in the seed layer may be increased by increasing the flow rate of C$_3$H$_6$ gas to be added to TCDMDS gas or SiH$_3$R gas. Also, the concentration of carbon in the seed layer may be suppressed from increasing by reducing the flow rate of C$_3$H$_6$ gas to be added to TCDMDS gas or SiH$_3$R gas. As a result, the controllability of the diameters of grains of the seed layer, i.e., the diameters of grains of the Si film formed on the seed layer may be easily greatly improved.

Also, according to the third embodiment, the etching resistance of the seed layer to, for example, hydrogen fluoride (HF) may be improved by increasing the concentration of carbon in the seed layer. Thus, the seed layer may be used as an etch stopper layer when the Si film is etched.

Also, as a carbon-containing gas to be added to TCDMDS gas or SiH$_3$R gas, not only C$_3$H$_6$ gas but also, for example, acetylene (C$_2$H$_2$) gas, ethylene (C$_2$H$_4$) gas, propane (C$_3$H$_8$) gas, etc. may be used. Also, when a gas that does not contain nitrogen (N) is used as the carbon-containing gas, the amount of nitrogen (N) in the seed layer may be reduced and the function of an entire film formed by stacking the seed layer and the Si film may be improved.

Fourth Embodiment of the Present Invention

In the first embodiment described above, a case in which a seed layer is formed on the wafer 200 by alternately performing a predetermined number of times the process of supplying TCDMDS gas to the wafer 200 and the process of supplying SiH$_3$R gas to the wafer 200 or by performing only the process of supplying TCDMDS gas a predetermined number of times has been described. However, the present invention is not limited thereto.

That is, as in a film forming sequence illustrated in FIG. 8, when TCDMDS gas is supplied to the wafer 200, for example, boron trichloride (BCl$_3$) gas may be supplied as a boron-containing gas together with the TCDMDS gas. In other words, the BCl$_3$ gas may be added to the TCDMDS gas to be supplied to the wafer 200.

Figure 8B:
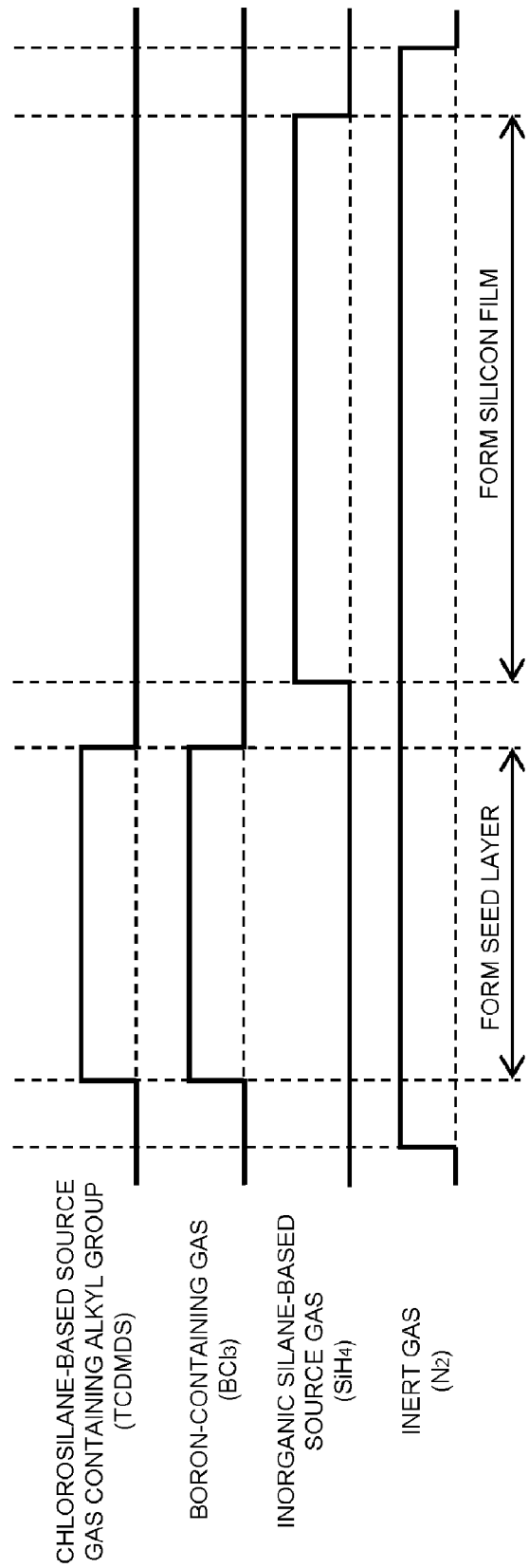

In detail, as in a first sequence illustrated in FIG. 8A, a seed layer containing silicon (Si), boron (B), and carbon (C) may be formed on the wafer 200 by alternately performing a predetermined number of times (at least once) a process of supplying TCDMDS gas and BCl$_3$ gas to the wafer 200 and a process of supplying SiH$_3$R gas to the wafer 200. Otherwise, as in a second sequence illustrated in FIG. 8B, a seed layer containing silicon (Si), boron (B), and carbon (C) may be formed on the wafer 200 by individually performing the process of supplying TCDMDS gas and BCl$_3$ gas to the wafer 200 once (continuously). Otherwise, as in a third sequence illustrated in FIG. 8C, a seed layer containing silicon (Si), boron (B) and carbon (C) may be formed on the wafer 200 by individually performing the process of supplying TCDMDS gas and BCl$_3$ gas to the wafer 200 a plurality of times (intermittently).

To supply TCDMDS gas and BCl$_3$ gas to the wafer 200, the valve 243e of the fifth gas supply pipe 232e is opened and BCl$_3$ gas is supplied into the fifth gas supply pipe 232e when the TCDMDS gas is supplied into the process chamber 201. The flow rate of the BCl$_3$ gas flowing through the fifth gas supply pipe 232e is controlled by the MFC 241e. The BCl$_3$ gas, the flow rate of which is controlled is supplied into the process chamber 201 from the gas supply holes 250c of the third nozzle 249c via the third gas supply pipe 232c, and exhausted from the exhaust pipe 231. Thus, the TCDMDS gas and the BCl$_3$ gas, i.e., the BCl$_3$ gas-added TCDMDS gas is supplied to the wafer 200.

In the first to third sequences illustrated in FIG. 8A to 8C, TCDMDS gas and BCl$_3$ gas may not be simultaneously supplied to the wafer 200 and may be alternately supplied to the wafer 200 a predetermined number of times (at least once). Also, in the first sequence of FIG. 8A, BCl$_3$ gas may be added to not only TCDMDS gas but also SiH$_3$R gas. In this case, SiH$_3$R gas and BCl$_3$ gas may not be simultaneously supplied to the wafer 200 and may be alternately supplied to the wafer 200 a predetermined number of times (at least once).

In the fourth embodiment, the effects similar to those when the first embodiment is performed may also be achieved.

Also, according to the fourth embodiment, boron (B) may be newly added to a seed layer by adding BCl$_3$ gas to TCDMDS gas or SiH$_3$R gas. Thus, the migration of Si atoms in the Si layer which is a base of the seed layer may be more securely suppressed and the grain size of the seed layer may be greatly reduced. That is, the grain size of the Si film formed on the seed layer may be greatly reduced. That is, the controllability of the diameters of the grains of the Si film may be improved.

Also, according to the fourth embodiment, the concentration of boron in the seed layer may be easily controlled by adjusting the flow rate of BCl$_3$ gas to be added to TCDMDS gas or SiH$_3$R gas. For example, the concentration of boron in the seed layer may be increased by increasing the flow rate of BCl$_3$ gas to be added to TCDMDS gas or SiH$_3$R gas. Also, the concentration of boron in the seed layer may be suppressed from increasing by reducing the flow rate of BCl$_3$ gas to be added to TCDMDS gas or SiH$_3$R gas. As a result, the controllability of the diameters of grains of the seed layer, i.e., the diameters of grains of the Si film formed on the seed layer may be easily greatly improved.

As the born-containing gas to be added to TCDMDS gas or SiH$_3$R gas, not only BCl$_3$ gas but also, for example, a boron halide-based gas such as boron trifluoride (BF$_3$) gas or an inorganic borane-based gas such as diborane (B$_2$H$_6$) gas may be used. Also, when such a gas that does not contain nitrogen (N) is used as the boron-containing gas, the amount of nitrogen (N) in the seed layer may be reduced and the function of an entire film formed by stacking the seed layer and the Si film may be improved.

Fifth Embodiment of the Present Invention

In the first embodiment described above, a case in which the process of forming the seed layer containing silicon (Si) and carbon (C) on the wafer 200 and the process of forming the Si film on the seed layer are performed has been described, but the present invention is not limited thereto.

That is, as in a film forming sequence illustrated in FIG. 9, a process of forming a seed layer containing silicon (Si) and carbon (C) on the wafer 200 by alternately performing a predetermined number of times (n times) a process of supplying TCDMDS gas to the wafer 200 and a process of supplying SiH$_3$R gas to the wafer 200 or by individually performing a process of supplying TCDMDS gas to the wafer 200 a predetermined number of times (n times); a process of forming an Si film on the seed layer by supplying SiH$_4$ gas to the wafer 200; and a process of forming a cap layer containing silicon (Si) and carbon (C), i.e., a layer formed by adding a small amount of carbon (C) to an Si layer as a base, on the Si film by alternately performing a predetermined number of times (m times) a process of supplying TCDMDS gas to the wafer 200 and a process of supplying SiH$_3$R gas to the wafer 200 or by individually performing a process of supplying TCDMDS gas to the wafer 200 a predetermined number of times (m times) may be performed.

Figure 9A:
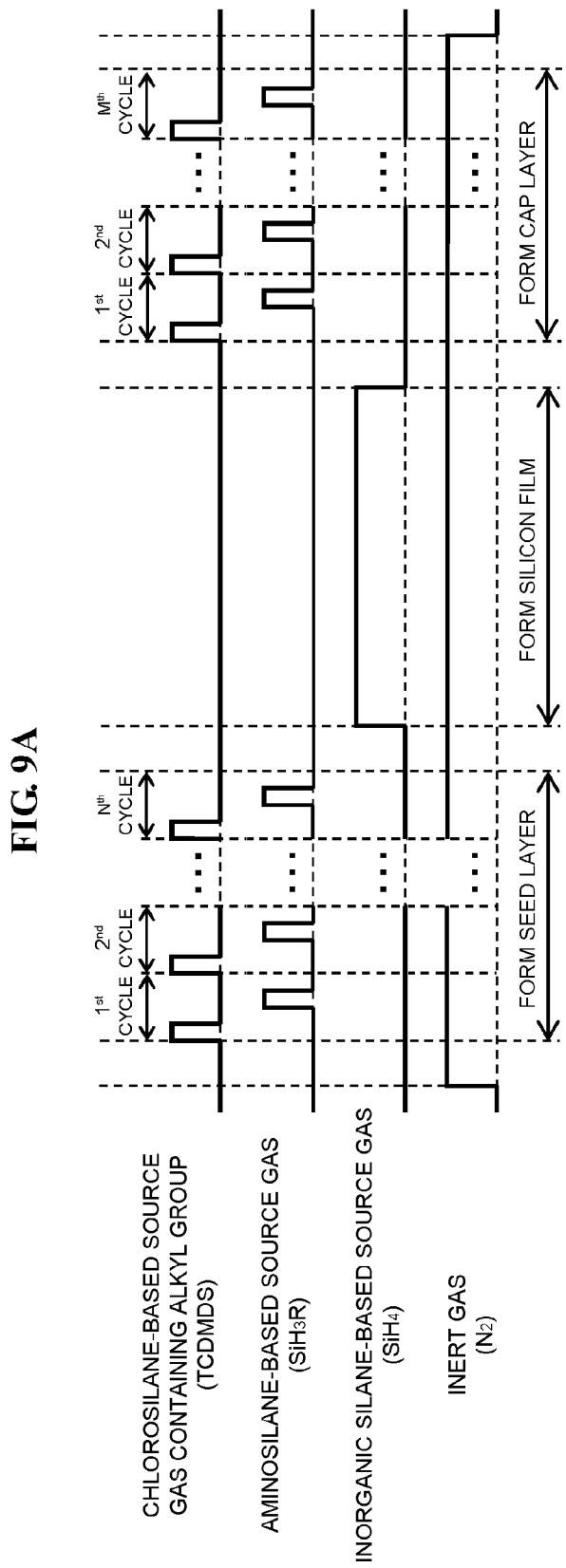
Figure 9C:
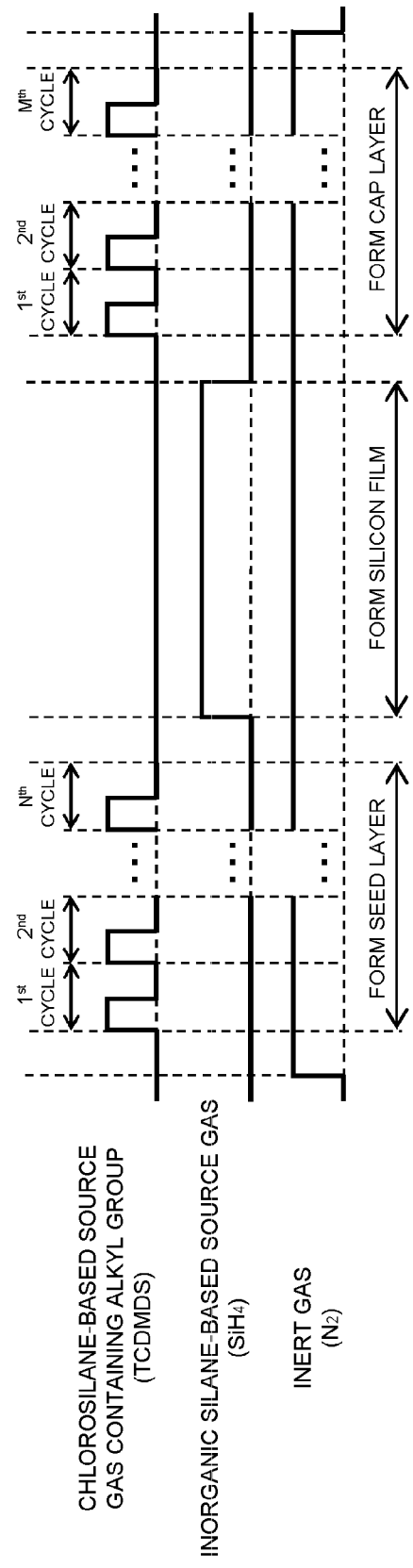

In detail, as in a first sequence illustrated in FIG. 9A, the cap layer containing silicon (Si) and carbon (C) may be formed on the Si film by performing the process of forming the Si film on the seed layer in the same process order and according to the same process conditions as in the first sequence of the first embodiment, and alternately performing a predetermined number of times the process of supplying TCDMDS gas to the wafer 200 and the process of supplying SiH$_3$R gas to the wafer 200. Otherwise, as in a second sequence illustrated in FIG. 9B, the cap layer containing silicon (Si) and carbon (C) may be formed on the Si film by performing the process of forming the Si film on the seed layer in the same process order and according to the same process conditions as in the second sequence of the first embodiment, and individually performing the process of supplying TCDMDS gas to the wafer 200 once (continuously). Otherwise, as in a third sequence illustrated in FIG. 9C, the cap layer containing silicon (Si) and carbon (C) may be formed on the Si film by performing the process of forming the Si film on the seed layer in the same process order and according to the same process conditions as in the third sequence of the first embodiment, and individually performing the process of supplying TCDMDS gas to the wafer 200 a plurality of times (intermittently).

In the fifth embodiment, the effects similar to those when the first embodiment is performed may also be achieved Also, in the fifth embodiment, the cap layer formed on the Si film has a high etch resistance to, for example, HF or the like and may be thus used as an etch protective layer of the Si film.

Also, in the fifth embodiment, not only the diameters of the grains of the seed layer or the Si film but also the diameters of the grains of the cap layer formed on the Si film may be controlled. That is, the diameters of the grains of a stack layer formed by stacking the seed layer, the Si film, and the cap layer may be controlled from a lower layer to an upper layer of the stack layer.

Sixth Embodiment of the Present Invention

In the first embodiment described above, a case in which the process of forming the seed layer containing silicon (Si) and carbon (C) on the wafer 200 and the process of forming the Si film on the seed layer are performed has been described, but the present invention is not limited thereto.

That is, as in a film forming sequence illustrated in FIG. 10, a process of forming an Si film on the wafer 200 by supplying SiH$_4$ gas to the wafer 200; and a process of forming a cap layer containing silicon (Si) and carbon (C), i.e., a layer formed by adding a small amount of carbon (C) to an Si layer as a base, on the Si film by alternately performing a predetermined number of times (n times) a process of supplying TCDMDS gas to the wafer 200 and a process of supplying SiH$_3$R gas to the wafer 200 or by individually performing a process of supplying TCDMDS gas to the wafer 200 a predetermined number of times (n times) may be performed.

Figure 10A:
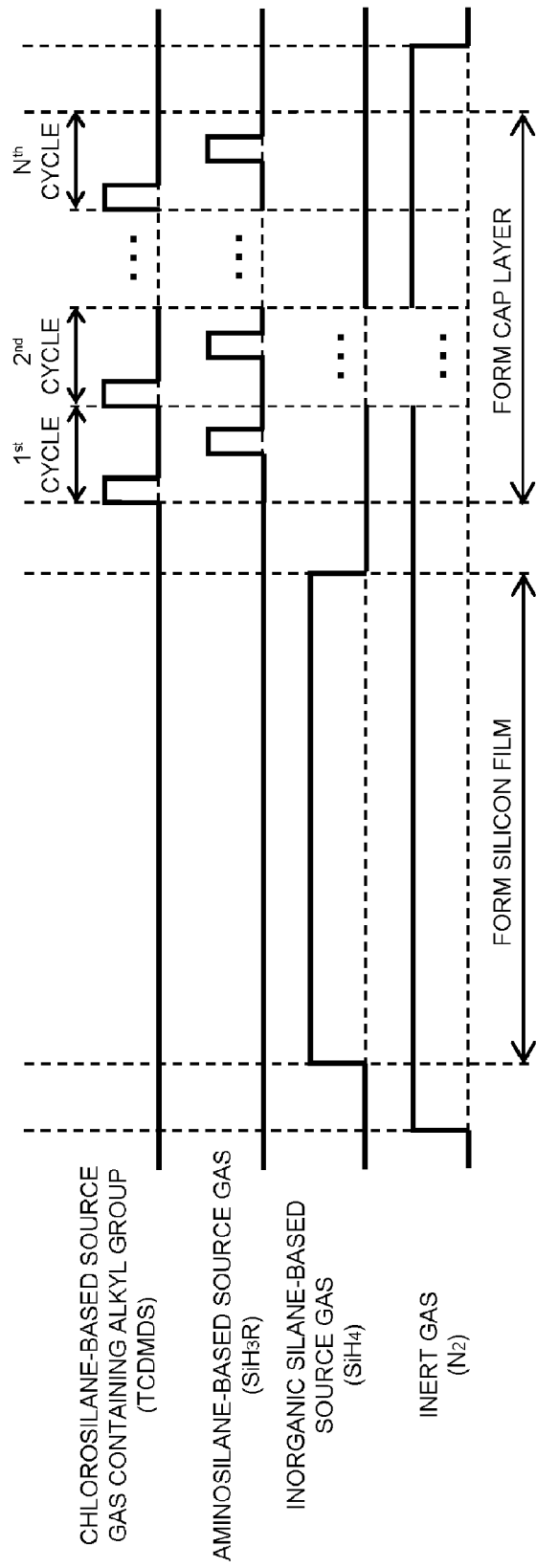
Figure 10B:
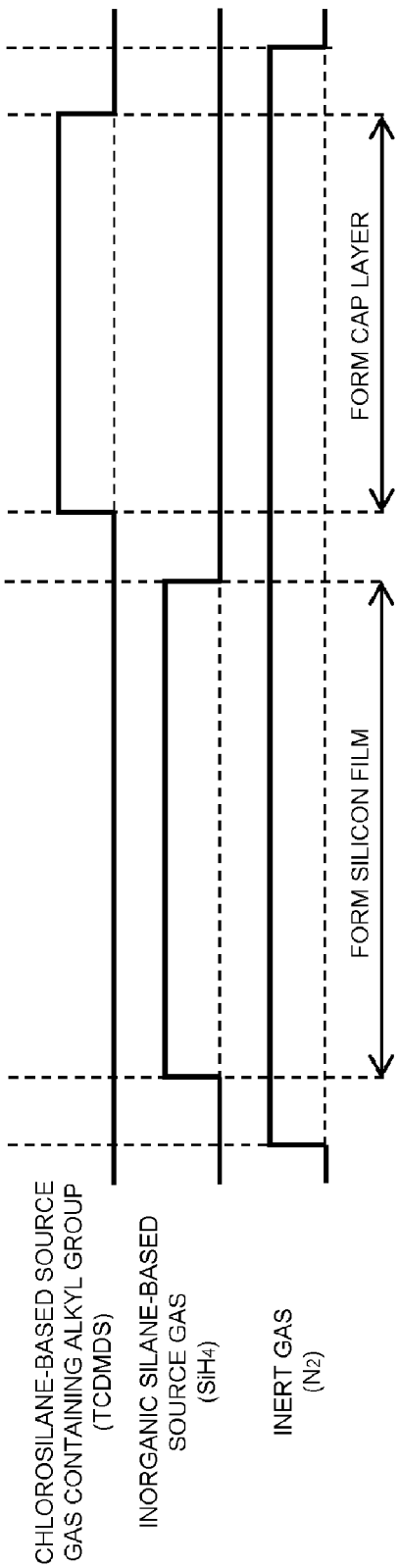
Figure 10C:
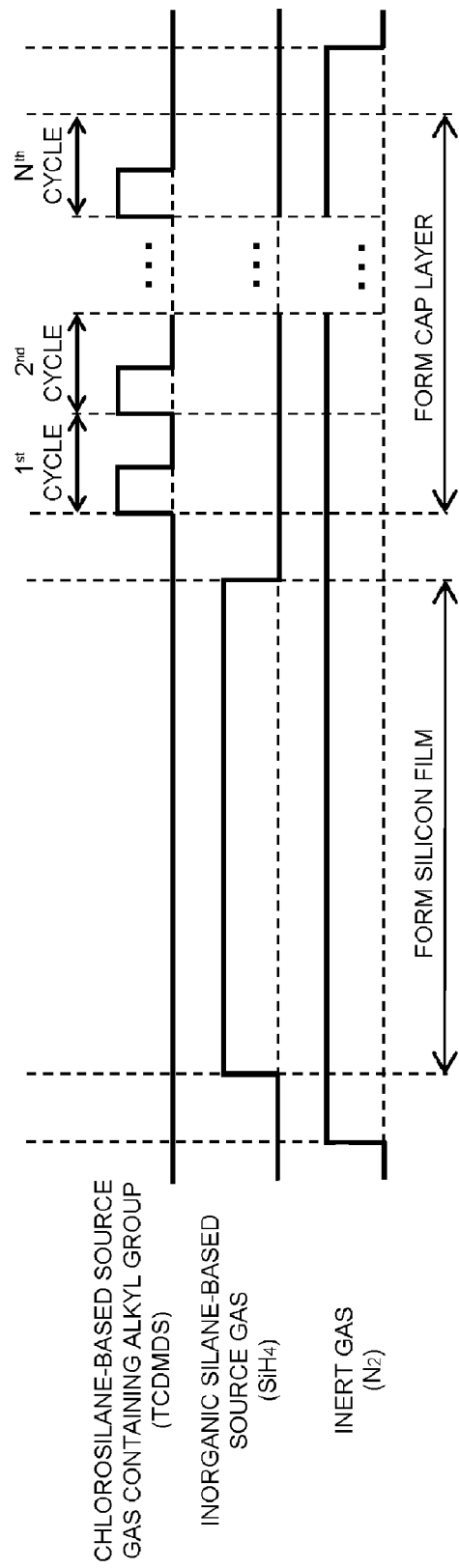

In detail, as in a first sequence illustrated in FIG. 10A, the cap layer containing silicon (Si) and carbon (C) may be formed on the Si film by performing the process of forming the Si film on the wafer 200, and alternately performing a predetermined number of times the process of supplying TCDMDS gas to the wafer 200 and the process of supplying SiH$_3$R gas to the wafer 200. Otherwise, as in a second sequence illustrated in FIG. 10B, the cap layer containing silicon (Si) and carbon (C) may be formed on the Si film by performing the process of forming the Si film on the wafer 200 and individually performing the process of supplying TCDMDS gas to the wafer 200 once (continuously). Otherwise, as in a third sequence illustrated in FIG. 10C, the cap layer containing silicon (Si) and carbon (C) may be formed on the Si film by performing the process of forming the Si film on the wafer 200, and individually performing the process of supplying TCDMDS gas to the wafer 200 a plurality of times (intermittently).

In the sixth embodiment, the effects similar to those when the first embodiment is performed may also be achieved. That is, the diameters of the grains of the cap layer formed on the Si film may be controlled. Also, the function of an entire film formed by stacking the Si film and the cap layer may be improved.

Also, in the sixth embodiment, the cap layer formed on the Si film has a high etch resistance to, for example, HF or the like and may be thus used as an etch protective layer of the Si film.

Other Embodiments of the Present Invention

Although various embodiments of the present invention have been described above in detail, the present invention is not limited thereto and may be embodied in various and different forms without departing from the spirit and scope of the invention as defined by the appended claims.

For example, although in the previous embodiments, cases in which when a seed layer is formed by alternately supplying a chlorosilane-based source gas containing an alkyl group (TCDMDS gas) and an aminosilane-based source gas (SiH$_3$R gas), the TCDMDS gas is first supplied and the SiH$_3$R gas is then supplied have been described above, the order of supplying these gases may be reversed. That is, the SiH$_3$R gas may be first supplied and the TCDMDS gas may be then supplied. That is, one of the chlorosilane-based source gas containing an alkyl group and the aminosilane-based source gas may be supplied and then the other gas may be supplied. As described above, the quality of the seed layer may vary when the order of supplying these gases is reversed. However, an action of chlorine (Cl) contained in the TCDMDS gas may be efficiently used and a film forming rate of the seed layer may be more increased when the TCDMDS gas is first supplied and then the SiH$_3$R gas is supplied as in the previous embodiments.

Also, although in the previous embodiments, cases in which monoaminosilane (SiH$_3$R) is used as the second source gas (aminosilane-based source gas) have been described, the present invention is not limited thereto. That is, as the second source gas, for example, an organic source gas such as diaminosilane(SiH$_2$RR') gas, triaminosilane(SiHRR'R") gas, and tetraaminosilane(SiRR'R"R'") gas may be used. That is, a source gas containing two, three, or four amino groups in an empirical formula (in one molecule) may be used as the second source gas. As described above, even if a source gas containing a plurality of amino groups in an empirical formula (in one molecule) is used as the second source gas, a seed layer having a small amount of impurities such as carbon (C) or nitrogen (N) may be formed in a low-temperature region.

However, the less the number of amino groups contained in the empirical formula of the second source gas, i.e., the less the amount of carbon (C) or nitrogen (N) contained in the composition of the second source gas, the easier the amount of impurities such as nitrogen (N) contained in the first layer may be reduced and the seed layer having an extremely low amount of impurities may be formed. Also, the amount of carbon (C) to be contained in the seed layer may be easily and appropriately controlled. That is, $SiH_3R$ gas, $SiH_2RR'$ gas, or SiHRR'R" gas is preferably used as the second source gas rather than when SiRR'R"R'" gas is used as the second source gas, since the amount of impurities in the seed layer may be more easily reduced and the amount of carbon (C) in the seed layer may be more easily and appropriately controlled. Also, $SiH_3R$ gas or $SiH_2RR'$ gas is more preferably used as the second source gas rather than when SiHRR'R" gas is used as the second source gas, since the amount of impurities in the seed layer may be more easily reduced and the amount of carbon (C) in the seed layer may be more easily and appropriately controlled. Also, $SiH_3R$ gas is more preferably used as the second source gas rather than when $SiH_2RR'$ gas is used as the second source gas, since the amount of impurities in the seed layer may be more easily reduced and the amount of carbon (C) in the seed layer may be more easily and appropriately controlled.

Also, a technique of forming a device having high processability may be provided by using a silicon film formed according to an embodiment of the present invention as an etch stopper. Also, the silicon film formed according to an embodiment of the present invention is preferably applicable to various fields, including, for example, a floating gate electrode or a control gate electrode of a semiconductor memory device, a channel silicon, a transistor gate electrode, a capacitor electrode of a dynamic random access memory (DRAM), a STI liner, a solar cell, etc.

Although in the previous embodiments, cases in which a silicon film (Si film) containing silicon which is a semiconductor element is formed as a thin film including a predetermined element have been described above, the present invention may be also applicable to cases in which a metal thin film containing a metal element such as titanium (Ti), zirconium (Zr), hafnium (Hf), tantalum (Ta), aluminum (Al), and molybdenum (Mo) is formed.

In this case, a process of forming a seed layer containing such a metal element and carbon on a substrate either by alternately performing a predetermined number of times a process of supplying a first source gas containing the metal element, an alkyl group, and a halogen group to the substrate and a process of supplying a second source gas containing such a metal element and an amino group to the substrate, or performing only the process of supplying the first source gas a predetermined number of times; and a process of forming a film containing such a metal element on the seed layer by supplying a third source gas containing the metal element free of alkyl group to the substrate are performed.

As described above, the present invention is applicable to not only a silicon-based thin film but also a metal-based thin film, and the effects similar to those when the previous embodiments are performed may be also achieved in this case. That is, the present invention is applicable to a case in which a thin film containing a predetermined element such as a semiconductor element or a metal element is formed.

In the previous embodiments, cases in which a thin film is formed using a batch-type substrate processing apparatus capable of processing a plurality of substrates at once have been described above. However, the present invention is not limited thereto and is preferably applicable to a case in which a thin film is formed using a single-wafer substrate processing apparatus capable of processing one or several substrates at once. Also, although in the previous embodiments, cases in which a thin film is formed using a substrate processing apparatus including a hot wall type process furnace have been described above, the present invention is not limited thereto and is preferably applicable to a case in which a thin film is formed using a substrate processing apparatus including a cold wall type process furnace.

Also, the previous embodiments or modification examples may be used in an appropriate combination thereof.

Furthermore, the present invention may be derived by changing, for example, a process recipe of a conventional substrate processing apparatus. In order to change the process recipe of the conventional substrate processing apparatus, a process recipe according to the present invention may be installed in the conventional substrate processing apparatus via an electrical communication line or a recording medium storing the process recipe, or the process recipe installed in the conventional substrate processing apparatus may be replaced with the process recipe according to the present invention by manipulating an I/O device of the conventional substrate processing apparatus.

According to the present invention, a method of manufacturing a semiconductor device which is capable of improving controllability of the diameters of grains of a film containing a predetermined element, such as a silicon film, when the film is formed, a substrate processing apparatus, and a non-transitory computer-readable recording medium may be provided.

Exemplary Embodiments of the Present Invention

Hereinafter, exemplary embodiments of the present invention will be supplementarily noted below.

(Supplementary Note 1)

According to one aspect of the present invention, there is provided a method of manufacturing a semiconductor device, including: (a) forming a seed layer containing a predetermined element and carbon on a substrate by performing a cycle a predetermined number of times, the cycle including alternately performing supplying a first source gas containing the predetermined element, an alkyl group and a halogen group to the substrate and supplying a second source gas containing the predetermined element and an amino group to the substrate, or by performing supplying the first source gas to the substrate a predetermined number of times; and (b) forming a film containing the predetermined element on the seed layer by supplying a third source gas containing the predetermined element and free of the alkyl group to the substrate.

(Supplementary Note 2)

In the method of supplementary note 1, it is preferable that the step (a) and the step (b) are performed under condition where a chemical vapor deposition reaction is caused.

(Supplementary Note 3)
In the method of supplementary note 1 or 2, it is preferable that the step (b) is performed under condition where the first source gas is thermally decomposed.

(Supplementary Note 4)
In the method of any one of supplementary notes 1 to 3, it is preferable that the step (b) is performed under condition where the second source gas is thermally decomposed.

(Supplementary Note 5)
In the method of any one of supplementary notes 1 to 4, it is preferable that the step (b) is performed under condition where the third source gas is thermally decomposed.

(Supplementary Note 6)
In the method of any one of supplementary notes 1 to 5, it is preferable that the step (a) and the step (b) are performed under condition where each of the first, second and third source gases is thermally decomposed.

(Supplementary Note 7)
In the method of any one of supplementary notes 1 to 6, it is preferable that the step (a) and the step (b) are performed while maintaining a temperature of the substrate in a constant range.

(Supplementary Note 8)
In the method of any one of supplementary notes 1 to 7, it is preferable that a thickness of the seed layer is less than that of the film.

(Supplementary Note 9)
In the method of any one of supplementary notes 1 to 8, it is preferable that a thickness of the seed layer ranges from 0.1 nm to 1 nm.

(Supplementary Note 10)
In the method of any one of supplementary notes 1 to 9, it is preferable that a concentration of carbon in the seed layer ranges from 0.01 at % to 5 at %.

(Supplementary Note 11)
In the method of any one of supplementary notes 1 to 10, it is preferable that the third source gas is free of an amino group.

(Supplementary Note 12)
In the method of any one of supplementary notes 1 to 11, it is preferable that the third source gas is free of a chloro group.

(Supplementary Note 13)
In the method of any one of supplementary notes 1 to 12, it is preferable that a composition formula (a single molecule) of the first source gas includes a plurality of alkyl groups.

(Supplementary Note 14)
In the method of any one of supplementary notes 1 to 13, it is preferable that a composition formula (a single molecule) of the first source gas includes a plurality of halogen groups.

(Supplementary Note 15)
In the method of any one of supplementary notes 1 to 14, it is preferable that a composition formula (a single molecule) of the second source gas includes at least one amino group.

(Supplementary Note 16)
In the method of any one of supplementary notes 1 to 14, it is preferable that a composition formula (a single molecule) of the second source gas includes one amino group.

(Supplementary Note 17)
In the method of any one of supplementary notes 1 to 16, it is preferable that the film containing the predetermined element includes a film having only a single element of the predetermined element.

(Supplementary Note 18)
In the method of any one of supplementary notes 1 to 17, it is preferable that the predetermined element includes a semiconductor element or a metal element.

(Supplementary Note 19)
In the method of any one of supplementary notes 1 to 17, it is preferable that the predetermined element includes silicon.

(Supplementary Note 20)
In the method of any one of supplementary notes 1 to 19, it is preferable that the first source gas includes at least one of 1,1,2,2-tetrachloro-1,2-dimethyldisilane and 1,2-dichlorotetramethyldisilane.

(Supplementary Note 21)
According to another aspect of the present invention, there is provided a method of manufacturing a semiconductor device, including: (a) forming a seed layer containing silicon and carbon on a substrate by performing a cycle a predetermined number of times, the cycle including alternately performing supplying a first source gas containing silicon, an alkyl group and a halogen group to the substrate and supplying a second source gas containing silicon and an amino group to the substrate, or by performing supplying the first source gas to the substrate a predetermined number of times; and (b) forming a silicon film on the seed layer by supplying a third source gas containing silicon and free of the alkyl group to the substrate.

(Supplementary Note 22)
According to another aspect of the present invention, there is provided a substrate processing method including: (a) forming a seed layer containing a predetermined element and carbon on a substrate by performing a cycle a predetermined number of times, the cycle including alternately performing supplying a first source gas containing the predetermined element, an alkyl group and a halogen group to the substrate and supplying a second source gas containing the predetermined element and an amino group to the substrate, or by performing supplying the first source gas to the substrate a predetermined number of times; and (b) forming a film containing the predetermined element on the seed layer by supplying a third source gas containing the predetermined element and free of the alkyl group to the substrate.

(Supplementary Note 23)
According to another aspect of the present invention, there is provided a substrate processing apparatus including:
a process chamber accommodating a substrate;
a gas supply system configured to supply a gas into the process chamber; and
a control unit configured to control the gas supply system to: form a seed layer containing a predetermined element and carbon on the substrate in the process chamber by performing a cycle a predetermined number of times, the cycle including alternately performing supplying a first source gas containing the predetermined element, an alkyl group and a halogen group to the substrate in the process chamber and supplying a second source gas containing the predetermined element and an amino group to the substrate in the process chamber, or by performing supplying the first source gas to the substrate in the process chamber a predetermined number of times; and form a film containing the predetermined element on the seed layer by supplying a third source gas containing the predetermined element and free of the alkyl group to the substrate in the process chamber.

(Supplementary Note 24)
According to another aspect of the present invention, there is provided a program causing a computer to perform:
(a) forming a seed layer containing a predetermined element and carbon on a substrate in a process chamber by performing a cycle a predetermined number of times, the cycle including alternately performing supplying a first source gas containing the predetermined element, an alkyl group and a halogen group to the substrate in the process chamber and supplying a second source gas containing the predetermined element and an amino group to the substrate in the process chamber, or by performing supplying the first source gas to the substrate in the process chamber a predetermined number of times; and (b) forming a film containing the predetermined element on the seed layer by supplying a third source gas containing the predetermined element and free of the alkyl group to the substrate in the process chamber.

(Supplementary Note 25)

According to another aspect of the present invention, there is provided a non-transitory computer-readable recording medium storing a program for causing a computer to perform:

(a) forming a seed layer containing a predetermined element and carbon on a substrate in a process chamber by performing a cycle a predetermined number of times, the cycle including alternately performing supplying a first source gas containing the predetermined element, an alkyl group and a halogen group to the substrate in the process chamber and supplying a second source gas containing the predetermined element and an amino group to the substrate in the process chamber, or by performing supplying the first source gas to the substrate in the process chamber a predetermined number of times; and (b) forming a film containing the predetermined element on the seed layer by supplying a third source gas containing the predetermined element and free of the alkyl group to the substrate in the process chamber.

What is claimed is:

1. A method of manufacturing a semiconductor device, comprising:
   (a) forming a seed layer containing a predetermined element and carbon on a substrate by performing a cycle a predetermined number of times, the cycle including alternately or simultaneously performing supplying a first source gas containing the predetermined element, an alkyl group and a halogen group to the substrate and supplying an inorganic second source gas containing the predetermined element to the substrate; and
   (b) forming a film containing the predetermined element on the seed layer by supplying a third source gas containing the predetermined element and free of the alkyl group to the substrate.

2. The method of claim 1, wherein (a) is performed under condition where at least one of the first source gas or the inorganic second source gas is thermally decomposed.

3. The method of claim 1, wherein (b) is performed under condition where the third source gas is thermally decomposed.

4. The method of claim 1, wherein (a) and (b) are performed under condition where the first source gas, the inorganic second source gas and the third source gas are thermally decomposed.

5. The method of claim 1, wherein (a) and (b) are performed while maintaining a temperature of the substrate in a constant range.

6. The method of claim 1, wherein a thickness of the seed layer is less than that of the film.

7. The method of claim 1, wherein a thickness of the seed layer ranges from 0.1 nm to 1 nm.

8. The method of claim 1, wherein a concentration of carbon in the seed layer ranges from 0.01 at % to 5 at %.

9. The method of claim 1, wherein the third source gas is free of an amino group.

10. The method of claim 1, wherein the third source gas is free of a chloro group.

11. The method of claim 1, wherein the third source gas comprises an inorganic source gas.

12. The method of claim 1, wherein a single molecule of the first source gas includes a plurality of alkyl groups.

13. The method of claim 1, wherein a single molecule of the first source gas includes a plurality of halogen groups.

14. The method of claim 1, wherein the third source gas is same as the inorganic second source gas in material.

15. The method of claim 1, wherein the film comprises a film consisting of the predetermined element.

16. The method of claim 1, wherein the predetermined element comprises one selected from a group consisting of Si, Ti, Zr, Hf, Ta, Al and Mo.

17. A substrate processing apparatus comprising:
   a process chamber configured to accommodate a substrate;
   a gas supply system configured to supply a gas into the process chamber; and
   a control unit configured to control the gas supply system so as to: form a seed layer containing a predetermined element and carbon on the substrate in the process chamber by performing a cycle a predetermined number of times, the cycle including alternately or simultaneously performing supplying a first source gas containing the predetermined element, an alkyl group and a halogen group to the substrate and supplying an inorganic second source gas containing the predetermined element to the substrate; and form a film containing the predetermined element on the seed layer by supplying a third source gas containing the predetermined element and free of the alkyl group to the substrate.

18. A non-transitory computer-readable recording medium storing a program for causing a computer to perform:
   (a) forming a seed layer containing a predetermined element and carbon on a substrate by performing a cycle a predetermined number of times, the cycle including alternately or simultaneously performing supplying a first source gas containing the predetermined element, an alkyl group and a halogen group to the substrate and supplying an inorganic second source gas containing the predetermined element to the substrate; and
   (b) forming a film containing the predetermined element on the seed layer by supplying a third source gas containing the predetermined element and free of the alkyl group to the substrate.

* * * * *